United States Patent
Ukraintsev et al.

(10) Patent No.: US 10,539,589 B2
(45) Date of Patent: Jan. 21, 2020

(54) THROUGH PROCESS FLOW INTRA-CHIP AND INTER-CHIP ELECTRICAL ANALYSIS AND PROCESS CONTROL USING IN-LINE NANOPROBING

(71) Applicant: DCG Systems, Inc., Fremont, CA (US)

(72) Inventors: Vladimir Ukraintsev, Allen, TX (US); Israel Niv, Los Altos Hills, CA (US); Ronen Benzion, Los Altos, CA (US)

(73) Assignee: FEI EFA, Inc., Fremont, CA (US)

( * ) Notice: Subject to any disclaimer, the term of this patent is extended or adjusted under 35 U.S.C. 154(b) by 303 days.

(21) Appl. No.: 14/751,017

(22) Filed: Jun. 25, 2015

(65) Prior Publication Data

US 2015/0377921 A1     Dec. 31, 2015

Related U.S. Application Data

(60) Provisional application No. 62/016,650, filed on Jun. 25, 2014.

(51) Int. Cl.
     *G01Q 30/02*      (2010.01)
     *G01R 31/26*      (2014.01)
     (Continued)

(52) U.S. Cl.
     CPC ............. *G01Q 30/02* (2013.01); *G01R 31/26* (2013.01); *H01J 37/28* (2013.01); *H01L 22/14* (2013.01);
(Continued)

(58) Field of Classification Search
     CPC ................ G01Q 30/02; G01R 31/2601; G01R 31/2891; G01R 31/26; H01J 2237/2008;
(Continued)

(56) References Cited

U.S. PATENT DOCUMENTS

| | | | |
|---|---|---|---|
| 4,101,072 | A | 7/1978 | Weaver et al. |
| 4,142,793 | A | 3/1979 | Schilling |

(Continued)

FOREIGN PATENT DOCUMENTS

| | | |
|---|---|---|
| DE | 102014118657 A1 | 6/2015 |
| DE | 112014002974 T5 | 6/2016 |

(Continued)

OTHER PUBLICATIONS

Examination Report for Taiwanese Patent Application No. 103143626 dated Mar. 22, 2016.
(Continued)

*Primary Examiner* — Jermele M Hollington
*Assistant Examiner* — Suresh K Rajaputra

(57) ABSTRACT

System for performing in-line nanoprobing on semiconductor wafer. A wafer support or vertical wafer positioner is attached to a wafer stage. An SEM column, an optical microscope and a plurality of nanoprobe positioners are all attached to the ceiling. The nanoprobe positioners have one nanoprobe configured for physically contacting selected points on the wafer. A force (or touch) sensor measures contact force applied by the probe to the wafer (or the moment) when the probe physically contacts the wafer. A plurality of drift sensors are provided for calculating probe vs. wafer alignment drift in real-time during measurements.

23 Claims, 7 Drawing Sheets

(51) Int. Cl.
*H01J 37/28* (2006.01)
*H01L 21/66* (2006.01)
*G01R 31/28* (2006.01)
*G01R 1/067* (2006.01)

(52) U.S. Cl.
CPC ...... *G01R 1/06744* (2013.01); *G01R 31/2831* (2013.01); *G01R 31/2891* (2013.01); *H01J 2237/208* (2013.01); *H01J 2237/2008* (2013.01); *H01J 2237/2817* (2013.01); *H01L 22/12* (2013.01)

(58) Field of Classification Search
CPC ......... H01J 2237/208; H01J 2237/2817; H01J 37/28
See application file for complete search history.

(56) References Cited

U.S. PATENT DOCUMENTS

| | | |
|---|---|---|
| 4,736,401 A | 4/1988 | Donges et al. |
| 4,798,989 A | 1/1989 | Miyazaki et al. |
| 4,874,945 A | 10/1989 | Ohi |
| 4,902,892 A | 2/1990 | Okayama et al. |
| 5,081,353 A | 1/1992 | Yamada et al. |
| 5,229,606 A | 7/1993 | Elings et al. |
| 5,239,313 A | 8/1993 | Marko et al. |
| 5,253,085 A | 10/1993 | Maruo et al. |
| 5,256,876 A | 10/1993 | Hazaki et al. |
| 5,267,471 A | 12/1993 | Abraham et al. |
| 5,312,510 A | 5/1994 | Poultney |
| 5,321,351 A | 6/1994 | Swart et al. |
| 5,373,372 A | 12/1994 | Loewen |
| 5,408,189 A | 4/1995 | Swart et al. |
| 5,455,420 A | 10/1995 | Ho et al. |
| 5,479,024 A | 12/1995 | Hillner et al. |
| 5,510,615 A | 4/1996 | Ho et al. |
| 5,710,052 A | 1/1998 | Alvis et al. |
| 5,713,667 A | 2/1998 | Alvis et al. |
| 5,763,879 A | 6/1998 | Zimmer et al. |
| 5,801,381 A | 9/1998 | Flecha et al. |
| 5,866,806 A | 2/1999 | Samsavar et al. |
| 5,899,703 A | 5/1999 | Kalter et al. |
| 5,905,577 A | 5/1999 | Wilsher et al. |
| 5,907,096 A | 5/1999 | Chen |
| 6,075,234 A | 6/2000 | Patterson |
| 6,258,326 B1 | 7/2001 | Modlin |
| 6,287,880 B1 | 9/2001 | Erickson et al. |
| RE37,404 E | 10/2001 | Harp et al. |
| 6,399,400 B1 | 6/2002 | Osann, Jr. et al. |
| 6,520,005 B2 | 2/2003 | McWaid et al. |
| 6,643,012 B2 | 11/2003 | Shen et al. |
| 6,752,008 B1 | 6/2004 | Kley |
| 6,880,389 B2 | 4/2005 | Hare et al. |
| 6,891,170 B1 | 5/2005 | Yu et al. |
| 6,951,130 B2 | 10/2005 | Hare et al. |
| 6,953,927 B2 | 10/2005 | Quake et al. |
| 6,955,078 B2 | 10/2005 | Mancevski et al. |
| 6,967,335 B1 | 11/2005 | Dyer et al. |
| 7,057,409 B2 | 6/2006 | Wills |
| 7,178,387 B1 | 2/2007 | Kley |
| 7,196,454 B2 | 3/2007 | Baur et al. |
| 7,220,973 B2 | 5/2007 | Yu et al. |
| 7,227,140 B2 | 6/2007 | Skidmore et al. |
| 7,285,778 B2 | 10/2007 | Baur et al. |
| 7,319,336 B2 | 1/2008 | Baur et al. |
| 7,446,550 B2 | 11/2008 | McDowell et al. |
| 7,493,794 B2 | 2/2009 | Mancevski et al. |
| 7,513,142 B2 | 4/2009 | Rice et al. |
| 7,562,564 B2 | 7/2009 | Baba et al. |
| 7,675,300 B2 | 3/2010 | Baur et al. |
| 7,716,970 B2 | 5/2010 | Watanabe et al. |
| 8,484,755 B2 | 7/2013 | Leach et al. |
| 8,536,526 B2 | 9/2013 | Bell et al. |
| 9,057,740 B1 | 6/2015 | Ukraintsev et al. |
| 2002/0178800 A1 | 12/2002 | Hasegawa et al. |
| 2003/0182993 A1* | 10/2003 | Hantschel ............ G01Q 70/06 73/105 |
| 2004/0133300 A1 | 7/2004 | Tsuboi et al. |
| 2004/0207424 A1* | 10/2004 | Hollman ............ G01R 1/07392 324/750.08 |
| 2005/0184028 A1* | 8/2005 | Baur ....................... G01N 1/28 216/92 |
| 2005/0193576 A1* | 9/2005 | Hollman ............ G01R 31/2891 33/286 |
| 2006/0261827 A1 | 11/2006 | Cooper et al. |
| 2006/0284083 A1 | 12/2006 | Kurenuma et al. |
| 2007/0179731 A1 | 2/2007 | Suri et al. |
| 2007/0187623 A1 | 8/2007 | Skidmore et al. |
| 2008/0065341 A1 | 3/2008 | Ishikawa et al. |
| 2008/0074126 A1 | 3/2008 | Rao |
| 2008/0078506 A1 | 4/2008 | Verbeck et al. |
| 2008/0078745 A1 | 4/2008 | Cordell et al. |
| 2008/0150559 A1 | 6/2008 | Nayak et al. |
| 2008/0180118 A1 | 7/2008 | Itou et al. |
| 2010/0205697 A1 | 8/2010 | Iyoki et al. |
| 2010/0257641 A1* | 10/2010 | Perkins ................. G01Q 40/02 850/1 |
| 2011/0005306 A1 | 1/2011 | Warren et al. |
| 2011/0035848 A1 | 2/2011 | Perkins et al. |
| 2011/0221461 A1 | 9/2011 | Kanev et al. |
| 2011/0252874 A1 | 10/2011 | Patten et al. |
| 2012/0090056 A1 | 4/2012 | Hirooka et al. |
| 2012/0119770 A1 | 5/2012 | Baebko et al. |
| 2012/0235036 A1* | 9/2012 | Hatakeyama ...... G01N 23/2251 250/310 |
| 2014/0132297 A1 | 5/2014 | Hwang et al. |
| 2014/0380531 A1 | 12/2014 | Ukraintsev et al. |
| 2015/0377958 A1 | 12/2015 | Ukraintsev et al. |

FOREIGN PATENT DOCUMENTS

| | | |
|---|---|---|
| JP | 10-283970 A | 10/1998 |
| JP | 2001-133381 A | 5/2001 |
| JP | 2003-156326 A | 5/2003 |
| JP | 2005-233700 A | 9/2005 |
| JP | 2008-089542 A | 4/2008 |
| JP | 2015-129749 A | 7/2015 |
| JP | 2016-530499 A | 9/2016 |
| TW | 200831853 A | 8/2008 |
| TW | 201102658 A1 | 1/2011 |
| TW | 201113528 A | 4/2011 |
| TW | 201532102 A | 8/2015 |
| TW | 201600861 A | 1/2016 |
| TW | 201611074 A | 3/2016 |
| WO | 2014/210083 A2 | 12/2014 |
| WO | 2015/200719 A1 | 12/2015 |
| WO | 2015/200724 A1 | 12/2015 |

OTHER PUBLICATIONS

Examination Report for Taiwanese Patent Application No. 104120476 dated Aug. 15, 2016.
Office Action for U.S. Appl. No. 14/314,013 dated Apr. 18, 2016.
Office Action for U.S. Appl. No. 14/314,013 dated Sep. 8, 2016.
International Search Report in International Patent Application No. PCT/US2014/043975, dated May 19, 2015.
Invitation to Pay Additional Fees in International Application No. PCT/US2014/043975, mailed Mar. 6, 2015.
Kane, T., Microelectron. Div., IBM Syst. Technol. Group, Hopewell Junction, NY, USA "In Fab 300 mm Wafer Level Atomic Force Probe Characterization," Proc. of the International Symposium for Testing and Failure Analysis, pp. 71-76.
Kane, T.; Microelectron. Div., IBM Syst. Technol. Group, Hopewell Junction, NY, USA "300mm wafer Atomic force probe characterization methodology", Physical and Failure Analysis of Integrated Circuits (IPFA), 2010 17th IEEE International Symposium on the Components, Circuits, Devices & Systems | Engineered Materials, Dielectrics & Plasmas, Jul. 5-9, 2010, Singapore, IEEE, pp. 1-3.
Kuhn, K. et al, Intel's 45nm CMOS Technology: "Managing Process Variation in Intel's 45nm CMOS Technology" Intel Technology Journal, vol. 12, Issue 2, Jun. 17, 2008, pp. 92-110.

(56) References Cited

OTHER PUBLICATIONS

Ukraintsev, V. et al., "Distributed force probe bending model of critical dimension atomic force microscopy bias", J. Micro/Nanolith. MEMS MOEMS, vol. 12, Issue 2, Apr.-Jun. 2013, pp. 23009-1 through 23009-15.
Vickers, J.S., Rubix: A Hybrid Between Ruby, LVi, & LVx The performance of Ruby with the simplicity of LVx, DCG Systems, Inc. Presentation, Technology Summit 2013, 18 pages.
Kleindiek Nanotechnik, ProbeWorkstation found online at http://www.nanotechnik.com/probeworkstation.html, website accessed Jun. 22, 2015, 3 pages.
Merlin Series: From Imaging to Your Complete Lab: Analytical Power for the Sub-Nanometer World, Interactive PDF, Release 1.0, ZEISS White Paper, downloaded from http://www.zeiss.com/microscopy/en_us/products/scanning-electron-microscopes/merlin-materials.html#downloads, on Jun. 22, 2015, 20 pages.
Nanonics Imaging Ltd., 3TB4000 Combined AFM FIB and AFM SEM found online at http://www.nanonics.co.il/products/nsom-spm-systems/combined-afm-fib-and-afm-sem.html?gclid=CJq59Lrnrr4CFWVp7AodeiMAYw, website accessed Jun. 22, 2015, 3 pages.
Park XE-3DM, Automated Industrial AFM for High-Resolution 3D Metrology Overview, found online at http://www.parkafm.com/index.php/products/industrial-afm/park-xe-3dm/overview, website accessed Jun. 22, 2015, 3 pages.
Zeiss: Merlin Analytical Power for the sub-nanometer world: Downloads, found online at http://www.zeiss.com/microscopy/en_us/products/scanning-electron-microscopes/merlin-materials.html#downloads, website accessed Jun. 22, 2015, 2 pages.
Zeiss: Merlin Analytical Power for the sub-nanometer world: Introduction, found online at http://www.zeiss.com/microscopy/en_us/products/scanning-electron-microscopes/merlin-materials.html#introduction, website accessed Jun. 22, 2015, 2 pages.
Advic, A. et al., "Fabrication of cone-shaped boron doped diamond and gold nanoelectrodes for AFM-SECM", Nanotechnology, IOP Publishing Mar. 3, 2011, vol. 22, 145306, pp. 1-6.
Altmann, F. et al., "Evaluation of combined EBIC/FIB methods for solar cell activation", Fraunhofer Institute for Mechanics of Materials Halle, Drei-Lander FIB Workshop, Jun. 28-29, 2010, in Wien, 23 pages.
Dickson, K. et al., "Electron Beam Absorbed Current as a Means of Locating Metal Defectivity on 45nm SOI Technology", ISTFA 2010, Proceedings from the 36th International Symposium for Testing and Failure Analysis, Nov. 14-18, 2010, Addison, TX, pp. 413-422.
Eifert, A. et al., "Atomic force microscopy probes with integrated boron doped diamond electrodes: Fabrication and application," Electrochemistry Communications, vol. 25, 2012, pp. 30-34.
Erington, K. et al., "Advanced Backside Defect Isloation Techniques Using Electron Beam Absornbed Current to Locate Metal Defectivity on Bulk and SOI Technology", ISTFA 2011, Proceedings from the 37th International Symposium for Testing and Failure Analysis, Nov. 13-17, 2011, San Jose, CA, pp. 275-286.
Gatan: An Introduction to EBIC: Whitepaper, Available online at http://info.gatan.com/acton/attachment/11413/f-02a3/1/-/-/-/-/App%20Notes%20Intro%20to%20EBIC%20FL2.pdf, accessed on Jun. 29, 2015, 6 pages.
Gatan: Smart EBIC: Product Datasheet, Available online at http://www.gatan.com/products/sem-imaging-spectroscopy/smartebic-system, accessed on Jun. 29, 2015, 4 pages.

Ippolito, S. et al., "Active Electrostatic Force Microscopy", Physical and Failure Analysis of Integrated Circuits (IPFA), 2015 22nd IEEE International Symposium, Taiwan, Jun. 29, 2015, Session 17-1, 3 pages.
Ippolito, S. et al., "Emerging Techniques in Atomic Force Microscopy: Diamond Milling and Electrostatic Force Microscopy", EDFAAO, Electronic Device Failure Analysis, vol. 17, Issue 3, 2015, pp. 4-10.
Kane, T. et al., "Wafer Level Atomic Force Probing", Proceedings from the 36th International Symposium for Tsting and Failure Analysis, Nov. 14-18, 2010, Addison, Texas, ISTFA 2010, pp. 317-319.
Larre, P. et al., "Precise Localization of 28nm via chain resistive defect using EBAC and nanoprobing", ISTFA 2012, Proceedings from the 38th International Symposium for Testing and Failure Analysis, Nov. 11-15, 2012, Phoenix, AZ, pp. 67-70.
Lin, W.P. et al., "Physical Failure Analysis Cases by Electron Beam Absorbed Current & Electron Beam Induced Current Detection on Nano-Probing SEM System", Physical and Failure Analysis of Integrated Circuits (IPFA), 2010 17th IEEE International Symposium, Singapore, Jul. 5-9, 2010, 4 pages.
Nagatani, G. et al., "Fault Isolation of Sub-surface Leakage Defects Using Electron Beam Induced Current Characterization in Next-Generation Flash Memory Technology Development", ISTFA 2010, Proceedings from the 36th International Symposium for Testing and Failure Analysis, Nov. 14-18, 2010, Addison, TX, pp. 62-65.
Quah, A.C.T. et al., "Failure Analysis Methodology on Resistive Open Defects", ISTFA 2014, Proceedings from the 40th International Symposium for Testing and Failure Analysis, Nov. 9-13, 2014, Houston, TX, ASM International, pp. 354-358.
Smirnov, W. et al., "Diamond-Modified AFM Probes: From Diamond Nanowires to Atomic Force Microscopy-Integrated Boron-Doped Diamond Electrodes", Anal. Chem. Volume 83, ACS Publications 2011, pp. 4936-4941.
Strizich, M. "Electron Beam Induced Current Isolation Techniques", Available online at http://www.analyticalsol.com/files/TechnicalArticles/EBIC_article.pdf, accessed Jun. 29, 2015, 3 pages.
Strizich, M. "Voltage Contrast and EBIC Failure Isolation Techniques", EDFAAO, Electronic Device Failure Analysis, vol. 9, Issue 1, 2007, pp. 20-23.
Yaliang, C. et al., "Absorbed-specimen Current Imaging Implementation and Characterization in Nano-Prober for Resistive Interconnects Isolation in 45-nm Silicon-on-Insulator Microprocessors", Physical and Failure Analysis of Integrated Circuits (IPFA), 2010 17th IEEE International Symposium, Singapore, Jul. 5-9, 2010, 5 pages.
Ippoloto, S., et al., "Diamond Milling with an Atomic Force Microscope," Physical and Failure Analysis of Integrated circuits (IPFA), 2015 IEEE 22nd International Symposium, Jun. 29-Jul. 2, 2015.
Notice of Allowance for U.S. Appl. No. 14/108,286 dated Feb. 11, 2015.
Office Action for U.S. Appl. No. 14/314,013 dated Nov. 18, 2015.
Invitation to Pay Additional Fees for PCT/US2015/037824 dated Sep. 8, 2015.
International Search Report and Written Opinion for International Patent Application No. PCT/US2015/037824 dated Dec. 4, 2015.
Invitation to Pay Additional Fees for PCT/US2015/037829 dated Sep. 8, 2015.
International Search Report and Written Opinion for International Patent Application No. PCT/US2015/037829 dated Dec. 7, 2015.

* cited by examiner

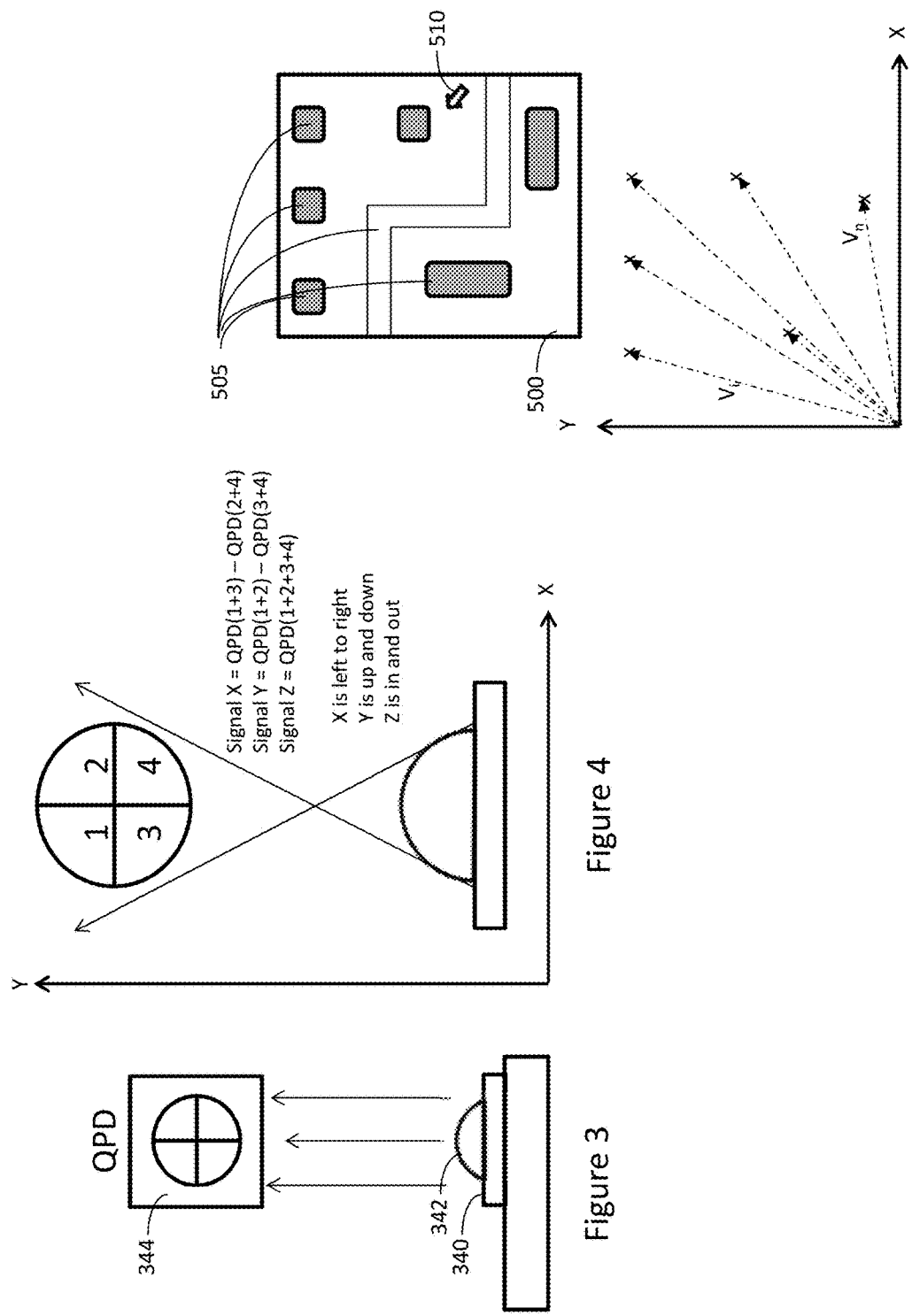

THROUGH PROCESS FLOW INTRA-CHIP AND INTER-CHIP ELECTRICAL ANALYSIS AND PROCESS CONTROL USING IN-LINE NANOPROBING

RELATED APPLICATION

This application claims priority benefit from U.S. Provisional Application, Ser. No. 62/016,650, filed Jun. 25, 2014, the disclosure of which is incorporated herein in its entirety.

BACKGROUND

1. Field of Invention

This invention is in the field of semiconductor manufacturing and, more specifically, enabling electrical measurements via nanoprobing at wafer level process monitoring to accomplish in-line monitoring, defect review and process control.

2. Related Art

Process engineers always tried to get as much information as possible about devices and circuits they built. Device information can be divided into two groups: physical and electrical characteristics. Electrical characteristics give the ultimate properties of the fabricated device and, if these conform to the design, nothing else is really needed for process monitoring and control. Certainly, electrical characteristics would be sufficient if a process never breaks or drifts over time. However, when the process does break or drift and factory yield goes down, process engineers need to perform failure analysis (FA) to investigate the failure and find out what process failed. At this point physical characteristics (such as critical dimensions (CD), film thickness and uniformity, chemical composition, interfaces, etc.) suddenly become important to know. Process engineers need to investigate at what specific step the process failed. Physical modeling of the devices is often used in order to understand the dependence of electrical properties on the device's physical parameters and process tolerances. This classical approach worked well for many years. Recently; however, this approach began failing and, due to increasing fabrication complexity, the approach's failure rate is predicted to increase.

In current and future chips, internal device and atomic dimensions become comparable. This means that surfaces and interfaces have significant impact on device properties. Bulk material models do not describe well dependencies of device electrical properties on dimensions, material composition (doping, Si oxynitride, Hf oxide, etc.) and physical characteristics. In addition, accuracy of dimensional metrology and physical characterization is also degrading. As a result, yield and process engineers confront a new challenge of finding a root cause of failure with less and less physical and dimensional information available for them.

To resolve this problem engineers have to use increasingly more electrical characteristics of the devices themselves. Unfortunately, the electrical data become available only when at least one level of interconnect is formed. In most cases, critical elements of circuitry may be tested only after several layers of interconnects are built. This takes time and resources, and often causes scrap of many expensive wafers.

Presently, no front-end in-line process monitoring is electrical. Virtually all electrical measurements are made at least after the first metal is fully fabricated (i.e., during back end fabrication). This is too late in the process as by that stage all of the processing required to fabricate the functional devices of the chip (i.e., transistors, memory cells, etc., generally referred to as front end) have been completed. If a problem occurred during the front end fabrication steps and was not detected during that time, many wafers are scrapped. The earlier the problem is found, the less loss is expected. The present front end monitoring tools often find defects which do not affect electrical performance and, otherwise, miss defects which do impact performance. Those that completely "kill" a device are called "killer defects." As a rule, they are only discovered after the IC is fully fabricated and tested electrically. The defective IC undergoes fault isolation and nanoprobing before the "killer" can be identified in physical failure analysis (PFA). Many of these "killer" and performance defects would be discovered early-on if electrical measurements were made early in the process flow. Therefore, electrical nanoprobing conducted systematically and early in the flow could catch (new) "killer" defects early and prevent wafer scrap.

In practice, electrical tests are performed using specially designed test structures, wherein almost all electrical test structures are located in scribe line because IC real estate is very expensive, especially on production chips. However, it is known to artisans in the field that electrical properties of devices depend on specific layout (micro loading effects) and also vary across die/chip (macro loading effects). The test structures, being on the scribe lines and not the actual chip, do not properly reflect the electrical performance of the actual devices within the chip. Therefore, intra-chip distribution of electrical properties of transistors from the impact of micro and macro loading effects on electrical characteristics are simply unknown.

In order to electrically test a circuit, a prober must physically contact the elements of the device within the IC. However, contact and scanning probers, such as atomic force probers (AFP) require contact and imaging force that exceeds the so-called "non-contact" force "accepted" by fabs (a few nanoNewtons or nN). Various proposals have been made in the past for ways to electrically characterize devices and critical circuits early in the process flow and even step by step through the flow. Examples of possible solution can be found in U.S. Pat. Nos. 5,899,703 and 6,399,400.

According to one proposal, a sacrificial layer of dielectric is deposited at the layer of interest. New specially designed pattern—which is different from the actual circuitry of the chip—is used to open via (or other conducting elements) of interest. The patterning can be done by optical lithography or using direct writing by e-beam or laser beam. The etching of dielectric, deposition of metal followed by polishing form sacrificial circuits used to test devices and circuits of interest. According to the authors, once testing is done the top metal and dielectric layers can be removed by etching and polishing and the standard flow can be continued.

According to another proposal, a specific case of fabrication of integral circuits (IC) using a so-called gate array IC wafer is envisioned. The authors suggest to stop at interconnect level at which speed of devices and circuits can be tested. The wafers then are sorted according to the obtained data on speed of their devices. The speed grading circuits are located on die or in scribe line. Customization of gate array IC wafer is done after test using remaining available layers of interconnect. The purpose of this proposal is to sort 'slow', 'medium', and 'fast' IC's prior to completion of fabrication.

In both examples U.S. Pat. Nos. 5,899,703 and 6,399,400 sacrificial layers (the top or the bottom ones) are used to do early electrical diagnostics of wafers and individual chips. In both cases it requires additional wafer processing including expensive high-resolution patterning of the top or bottom layers. The additional processing and de-processing of wafers increase the risk of misprocessing and wafer scrap. In both cases placement of large test structures (standard test structure has 40 contact pads, each one of them with dimensions 50×50 um$^2$ or more) is limited by high cost of wafer and chip real estate. For instance, it is difficult to imagine placement of several test structure across chip e.g., to test macro-loading effects. Also use of standard electrical test structures is limiting investigation of micro-loading effects since test structures have specific layout. Both approaches are too complex or/and risky to try to implement them step by step through process flow. In other words, these methods can be used occasionally and most likely off-line to solve complex monitoring problems but it is very hard to imagine that these methods will be used routinely, in-line for process monitoring and control. This is just impractical.

Several nanoprobes capable of electrical testing of individual transistors and critical circuits have been developed. Modern nanoprobes are capable of electrical testing of individual devices (transistors, diodes, etc.) and circuits of a single chip, and are most commonly used for failure analysis. These tools operate on single chips, not on wafer-size samples. AFM-based nanoprobe have also been used for non-destructive in-line electrical probing of chips at post-contact chemical-mechanical polishing (CMP) process step. Unfortunately, implementation of in-line AFP for wafer-size samples has several significant obstacles, some examples are as follows.

(1) Sample and probe damage caused by high probe force necessary for establishing low resistance probe-sample contact:
Particle generation and wafer contamination,
IC contact damage (smearing),
Poor AFP spatial resolution caused by damaged dull probes.
(2) Wafer modification and deviation from the standard process flow:
Interlayer dielectric etching required to reveal contact's location from the metal/dielectric topography (contacts can't be found using AFM on most post CMP samples),
Metal oxide removal and cleaning process steps are required prior AFP (contact corrosion is caused by reaction of metal with CMP slurry or/and atmospheric gases).

As a result, to date no wafer level in-line nanoprobing device has been developed. Instead, new methods, including off-line nanoprobing, are used today to replace classical process control schemes. These expensive off-line techniques are used today for technology development, ramp up and even manufacturing control. This change impacts cost of technology development and manufacturing and also contributes to a systematic reduction of yield observed for the latest technologies.

No SEM-based in-line wafer level AFM or nanoprobe is known today. Several versions of off-line SEM-based AFM's and nanoprobes are known, which may be used to test chips. Carl Zeiss' Merlin SEM can be combined with AFM and optical microscope. Details can be found in the "MERLIN series" brochure by Carl Zeiss. The 3TB 4000 system is a combined AFM, FIB and SEM by Nanonics Imaging Ltd. This AFM uses laser-free tuning fork force sensor. Other examples of SEM and AFM hybrid tools are Attocube Systems AG (www.attocube.com), and Nanosurf AG (www.nanosurf.com), Kleindiek Nanotechnik GmbH (www.kleidiek.com). A system having nanoprobes and charged particle beam device used for testing individual chips or devices (DUT) is disclosed in, for example, U.S. Pat. Nos. 7,285,778, 7,319,336, 7,675,300 and 8,536,526. These systems; however, cannot be used to test chips within wafers and cannot be used in-line. Research oriented off-line SEM- and FIB-based nanoprobes have been designed by Kleindiek Nanotechnik GmbH. The next level of SEM-based nanoprobing is provided by DCG Systems, Inc. The latest model nProber II is an off-line SEM-based automated nanoprobe with 12.5×12.5 mm$^2$ load-locked sample, eight low drift probes and overall capability suitable for 10 nm technology.

Problem to be Solved

In the above described systems, the nanoprobes are attached either to the sample stage or a side door of the vacuum chamber. This provides easy access to the nanoprobes for service, and also enables easy reach of the nanoprobes forks to the area of interest on the samples. However, the samples used in such devices are extremely small, compared to semiconductor wafers. Therefore, use of such arrangement for in-line probing of wafers is not possible. For example, the scanning reach of nanoprobe forks is measured in a few millimeters, e.g., up to about 10 mm. On the other hand, the diameter of wafers is 200 mm, 300 mm and soon to be 450 mm, i.e., more than an order of magnitude of the maximum reach of a nanoprobe fork. Thus, mounting the nanoprobe on the sample stage or on the sidewall door of an SEM vacuum chamber would mean that the nanoprobe can only test the other periphery of the wafer, but would not be able to reach and area of interest interior to the wafer. That is, for incorporating an SEM with nanoprobe, changing the sample size from chips to wafers creates many barriers that must be overcome.

Monitoring of electrical characteristics of critical devices and circuits while still in wafer form (including intra-chip and inter-chip) would be extremely helpful for yield improvement and process maintenance. It would be extremely beneficial to combine SEM and nanoprobing of wafers through process flow and to assist in advanced process control (APC). Such newly obtained information would significantly reduce failure analysis (FA) cycle time and, therefore, amount of scrapped material and improved yield ramp.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

One objective of this invention is to respond to the crisis of process control and provide solution(s) to problems of known art by providing novel in-line nanoprobing methods and instruments.
Remaining problems with in-line AFP approach include:
Particle generation and wafer contamination,
Limited reach of nanoprobe fork,
Travel and landing speed of nanoprobe,
slow target acquisition of nanoprobe,
IC contact damage (smearing), Poor AFP spatial resolution caused by damaged dull probes, Required by AFP wafer modification and deviation from the standard process flow (interlayer dielectric etching, corroded contact cleaning, etc.).

Using a scanning electron microscope (SEM) for imaging assistance during nanoprobing should help to resolve: (a) sample-probe damage and imaging degradation problems related to using AFP probes for both AFM imaging and nanoprobing, (b) need of wafer modification to create metal/dielectric contrast, (c) need of additional wafer cleaning after CMP to improve AFM quality and reduce risk of probe contamination by particles during sample scanning (d) reduce target acquisition time. However, to provide process control SEM-based nanoprobing should be done on wafer-size sample, on intra- and inter-chip level, in-line at different steps of process flow with negligible degree of damage, contamination and chip/device modification and multiple and safe returns of wafer back to manufacturing line.

Problems with SEM-based nanoprobing implementation include:

Lack of wafer size sample SEM-based nanoprobe design,
Insufficient speed, precision and accuracy of on sample navigation,
Unacceptable high level of thermal and mechanical probe vs. sample drift,
Lack of force control during nanoprobing (for damage and particle free operation),
Insufficient automation for hands-free recipe driven nanoprobing,
Lack of reliable automated electrical data assessment, acceptance and evaluation,
Long navigation, sample surface approach and data collection time (low throughput).

Various embodiments of the invention provide an in-line nanoprobing apparatus that solve the above noted problems. According to some embodiments, the apparatus comprises the following features: industrial quality wafer level in-line SEM, use of force sensor such as tuning forks for fast and safe landing control, use of SEM to enable multiple target acquisition and simultaneous multiple probe landing, use of real-time SEM image feedback to assist in nanoprobe landing, use of learning mode to automatically identify targets, use of OQS (optical quadrant sensors) to track wafer drift for feedback to SEM deflectors, and use of OQS to track probe drift for feedback to probe positioners.

The disclosed embodiments for in-line nanoprobing address the following technical challenges:
1. Integration of 200/300/450 mm wafer level SEM with a high performance nanoprobes,
2. Fast (a few seconds) probe positioning on such wafer with a few nanometer level of accuracy (achieving the minimum uncertainty of probe positioning),
3. Fast (a few seconds) and safe (gentle, nN force level) probe landing on wafer features,
4. Low nm/min system mechanical and thermal drifts combined with fast stage motion,
5. High throughput tool operation.

The disclosed embodiments for integration of a wafer level SEM and a nanoprobe system incorporate system development for insertion of nanoprobe into an industrial quality SEM, while utilizing existing industry solutions of wafer handling and navigation and focus. Utilizing an existing industrial SEM immediately brings solution for two problems of in-line prober implementation: (1) probing of large wafer size samples and (2) fast, accurate and fully automated navigation on wafer. Use of industrial SEM for wafer handling and navigation is a significant step toward high-throughput recipe driven nanoprobing since existing industrial systems provide an excellent (a few seconds) move-acquire-measure (MAM) time.

According to some embodiments, a CD SEM is utilized for the nanoprobe and wafer level SEM integration (examples: AMAT's VeritySEM4i and Hitachi's CG5000) since it provides high-throughput, fully automated navigation, high resolution imaging with low e-beam energy and current, remote off-wafer recipe setup (navigation part), etc. However, a defect review SEM and e-beam inspection system may also be suitable for other embodiments requiring different features more suitable for DR SEM (defect review SEM) and EBI (e-beam inspection).

Hands-free nanoprobing should include many levels of tool automation: (1) prober self-testing, calibration and preparation for measurements, (2) sample and probe automatic loading and fast, and accurate on-wafer navigation at nanometer scale, (3) quick sample surface approach by probe with force, contact resistance and damage control, (4) electrical data collection, assessment, acceptance and engineering evaluation. To provide manufacturing with a reasonable amount of data, the in-line prober should be capable of throughput close to one site per minute (or in other terms close to 6 wafers per hour when about 10 sites per wafer are examined).

BRIEF DESCRIPTION OF THE DRAWINGS

Other aspects and features of the invention would be apparent from the detailed description, which is made with reference to the following drawings. It should be mentioned that the detailed description and the drawings provide various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 3 illustrates an embodiment of an optical setup for monitoring drift of target due to e.g., thermal expansion.

FIG. 4 illustrates an embodiment of an optical setup for monitoring of co-alignment of two objects in three-dimensions.

FIG. 5 illustrates an embodiment for target acquisition and assignment to multiple nano-probers.

DETAILED DESCRIPTION

Figure 1A:
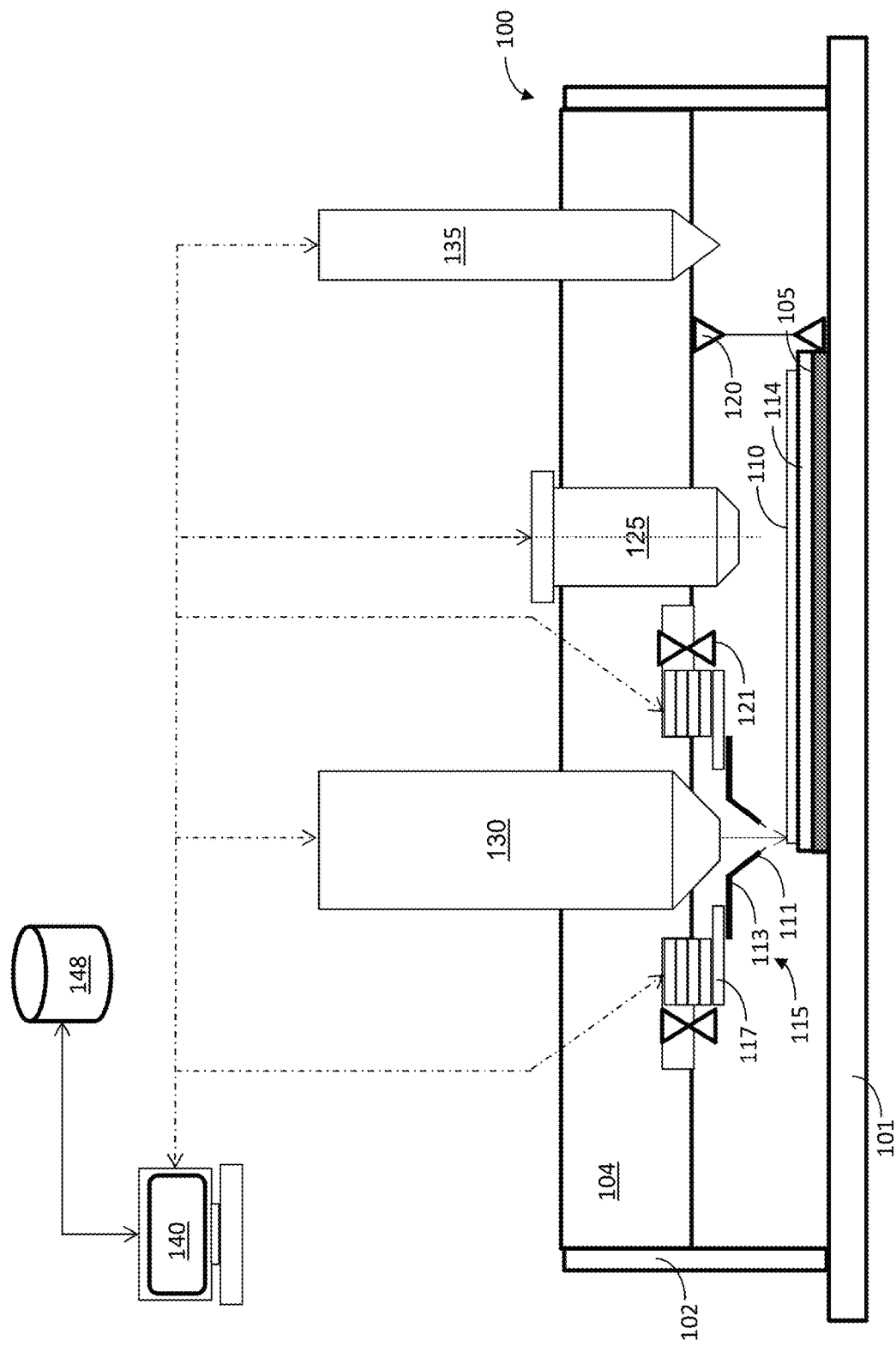
FIG. 1A is a cross-sectional view illustrating an embodiment for integration of CD SEM, optical microscope and nanoprobe, and optional ION GUN.
Figure 1B:
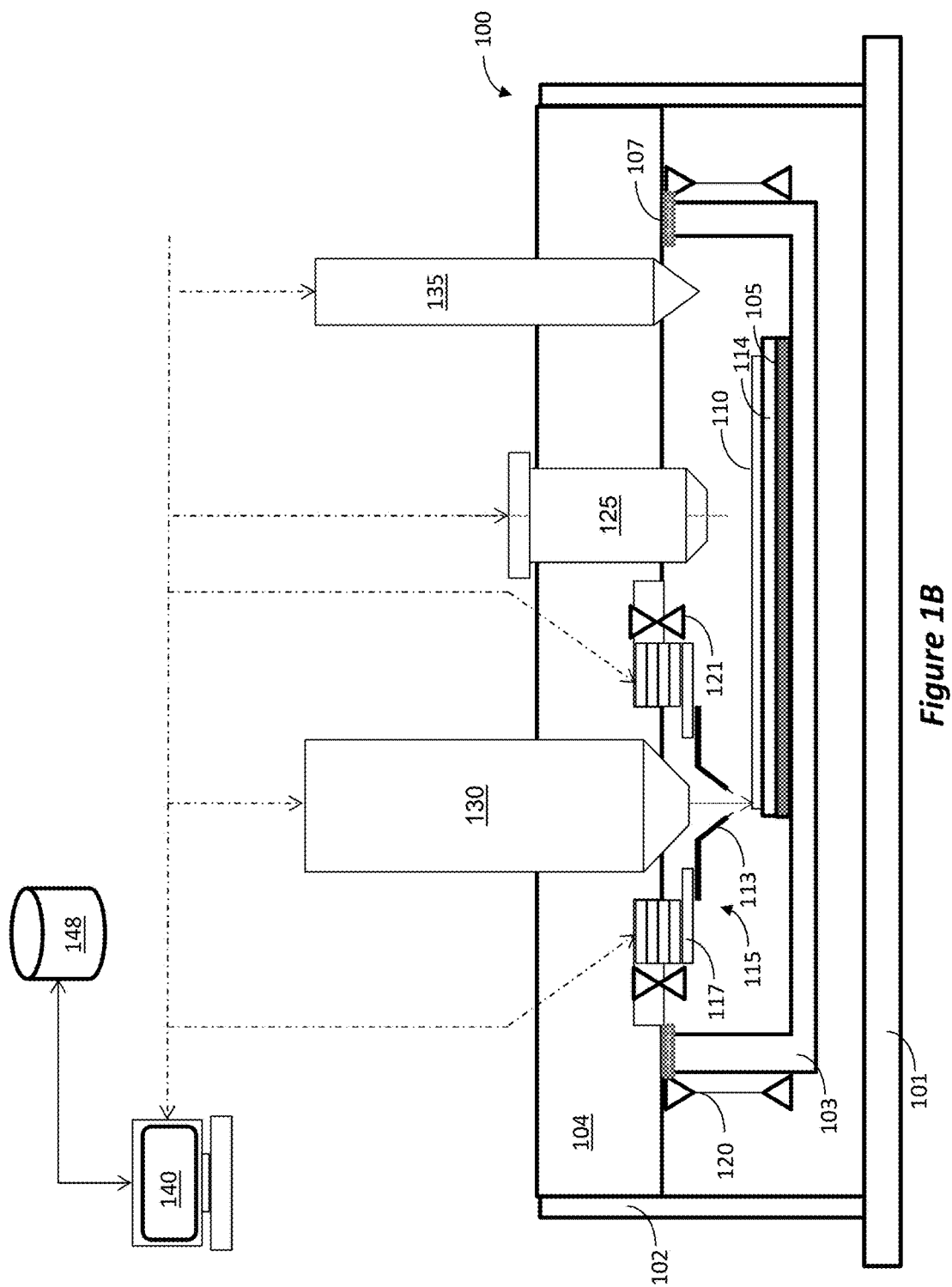
FIG. 1B is a cross-sectional view illustrating another embodiment for integration of CD SEM, optical microscope and nanoprobe, and optional ION GUN.
Figure 1C:
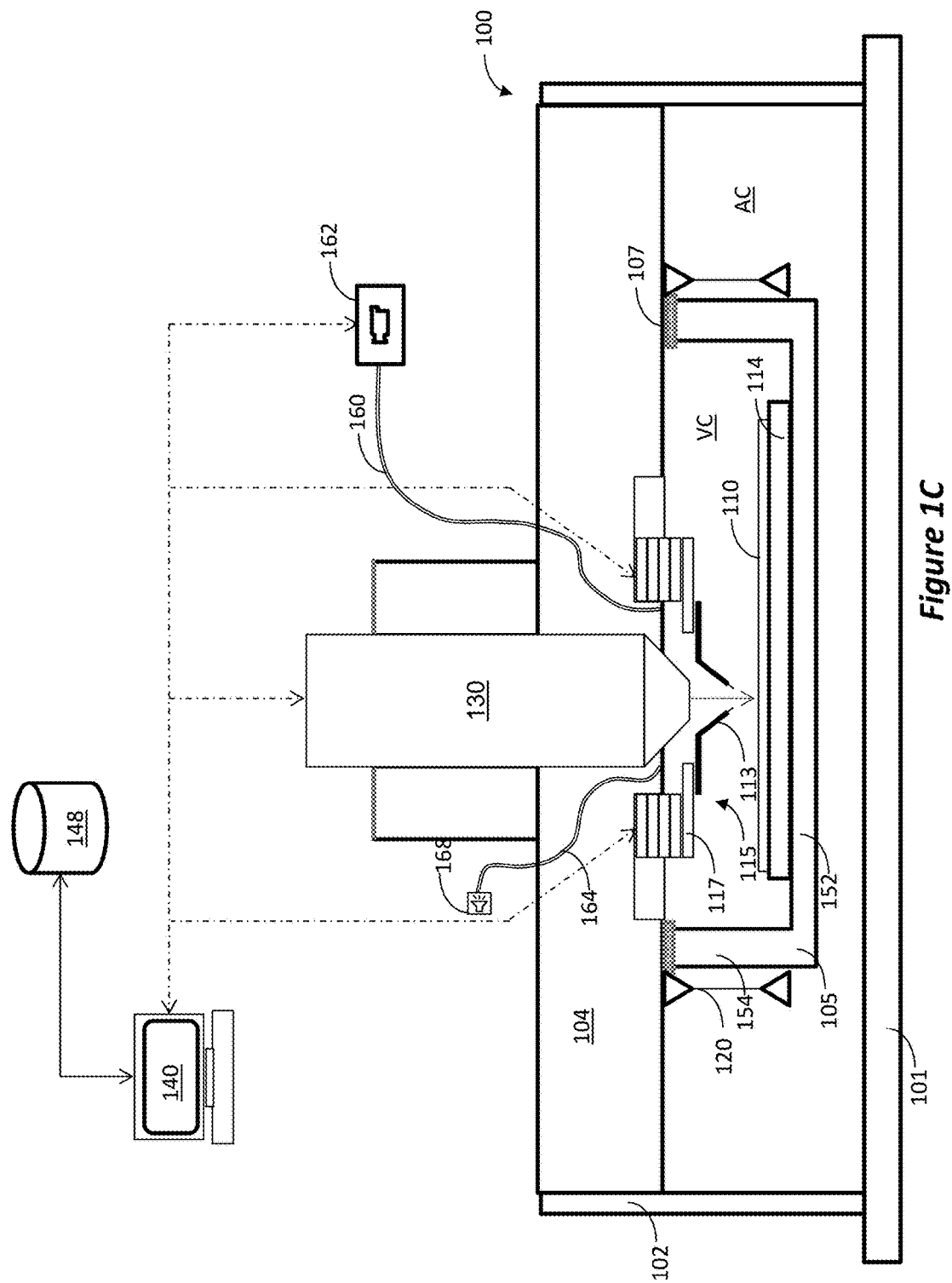
FIG. 1C is a cross-sectional view illustrating yet another embodiment for integration of CD SEM, optical microscope and nanoprobe, and optional ION GUN.

FIGS. 1A-1C illustrate various embodiments for the integration of in-line wafer level nanoprobe 115 with a wafer level SEM 130. The SEM can be used for standard SEM imaging of the region of interest (ROI) and for navigation and landing of the nanoprobes 115, including, in some embodiments, real time feedback for navigation and landing assistance. The nanoprobes may be used to perform parametric testing and characterization of the devices (e.g., transistors) within the ROI. Additionally, the SEM can be used to image the ROI while the nanoprobes are operated to perform the testing. For example, the nanoprobes may be used to drive current into the devices in the ROI, thereby changing the potential in certain areas of the ROI. The change in potential will cause a change in the SEM image. Similarly, certain shorts or resistance areas will cause a localized increase in temperature, which may also be visible in an SEM image. However, to achieve these objectives, the nanoprobes should be placed in close proximity to the optical axis of the electron column, such that they can be inserted into and removed from the line of sight of the SEM column. This feature is described in more details below, when explaining FIGS. 1A-1C.

The illustrated system may be used for development of new process line, for yield enhancement of a process line, and for in-line health monitoring. In one implementation, the system may be used as a defect review system, akin to DR-SEM, wherein when a wafer inspection reveals defects, the wafer is transferred to the system together with a defect map obtained from the inspection system. The defect map is used to navigate to the defect location and the SEM is used to image the area of the defect, assist in landing the nanoprobes on different structures imaged by the SEM, and obtain further SEM images simultaneously as the nanoprobe perform parametric testing and characterization.

In prior art, when an SEM image is taken, the image has dark areas, bright areas, and grey areas. The dark and bright areas signify areas having high electrical potential and areas having low electrical potential (e.g., ground). However, it is impossible in the prior art to understand what is the significance of the grey areas and, therefore, in the prior art the device is being cut in order to inspect the structures at the grey areas. However, the investigation performed is of the sectioned structure physical, not electrical, characteristics. Conversely, using the system described herein, the nanoprobes are directed to land on structures shown in the grey areas so as to perform parametric testing and characterization of these structures. Additionally, during the time that the nanoprobes test the structures in the grey areas, subsequent images are taken with the SEM and are compared to SEM images taken before the nanoprobes landed on the structures. Such comparison can lead to identification of opens, shorts and resistive shorts.

Turning to FIG. 1A, a navigation stage 105 is positioned inside a tester chamber 100, which is generally defined by floor 101, sidewalls 102, and ceiling 104. Vacuum environment is maintained within the entire interior of chamber 100. The navigation stage 105 is attached to the floor 101 and incorporates standard bearings and motors enabling translation in X-Y and elevation in Z-directions, thus generating relative movement between the stage 105 and the ceiling 104. A chuck 114 is mounted onto the top of the stage 105, to support wafer 110 thereupon. The chuck may be an electrostatic chuck, a mechanical chuck, or a simple susceptor without chucking ability.

In this embodiment, the ceiling 104 is stationary, i.e., fixedly attached to the vacuum chamber sidewalls 102, and includes mounting implements enabling mounting of an optical microscope 125 and an SEM column 130. Optionally, an ion gun 135 may also be installed. The ion gun may be, e.g., a plasma ion gun, a focused ion beam (FIB), etc. The registration between the optical axis of the optical microscope 125, the optical axis of the SEM 130, and the optical axis of the ion gun 135 is known and stored in the controller 140. Controller 140 controls the operation of the system and analyzes and stores the data generated by the optical microscope 125, SEM 130, ion gun 135, and nanoprobes 115. In this disclosure, the optical microscope 125, SEM 130, ion gun 135, and nanoprobes 115, may sometimes be referred to collectively as microscopes, insofar as each of these devices may be used to see objects that are too small for the naked eye.

A wafer 110 is placed on the chuck 114, which is mounted onto the stage 105, such that it can be moved in X-Y directions and in Z direction to thereby place any ROI within the wafer under the optical axis of the optical microscope 125, the SEM 130 and the ion gun 135. In some embodiments, the stage 105 may also incorporate rotational motion. Notably, by incorporating rotational motion the vacuum chamber may be made smaller, such that it is may extend only a distance slightly larger than the radius of the wafer from the optical axis of the microscopes. This enables the stage to place the center of the wafer under the optical axis of any of the microscopes.

In the embodiments of FIGS. 1A-1C, each of probes 115 includes a probe fork 113 and a probe positioner 117. The probes 115 are attached to the ceiling 104 in close proximity to column. At the end of the fork 113 there is a probe tip 111, which is at a nano-scale size. The tip is generally made of conductive material, such as tungsten, platinum, gold, conductor-coated or conductively-doped diamond, etc. In this context, close proximity means that the probes can be brought to within the column's field of view and optimal (focal) working distance; such that the SEM column can image the probes and may also simultaneously image the probes and the ROI, when placed within the focal depth of the SEM. That is, each of the probe positioners 117 is able to place its fork 113, and thereby the probe tip 111, within the field of view of the SEM. At the same time, the range of probe motion should be large enough to move the probes out of field of view of the SEM to provide the optimal electrostatic field distribution for SEM column tuning and high-resolution imaging. Note that the SEM, optical microscope, ion gun, and nanoprobe, are rigidly attached to each other via the ceiling 104, and only the wafer moves underneath them in three-dimensions so as to bring the ROI to the optimal analytical spot via the navigation of the wafer stage 105. The nanoprobe positioners 117 are attached to the ceiling 104 in registration to the optical axis of the SEM, so as to fine tune the placement of the probe and for guiding probe landing. Placing positioners and probes above the wafer removes critical restrictions on sample size of SEM-based prober and provides a rigid registration between the probers and the optical axis of the SEM.

Figure 2A:
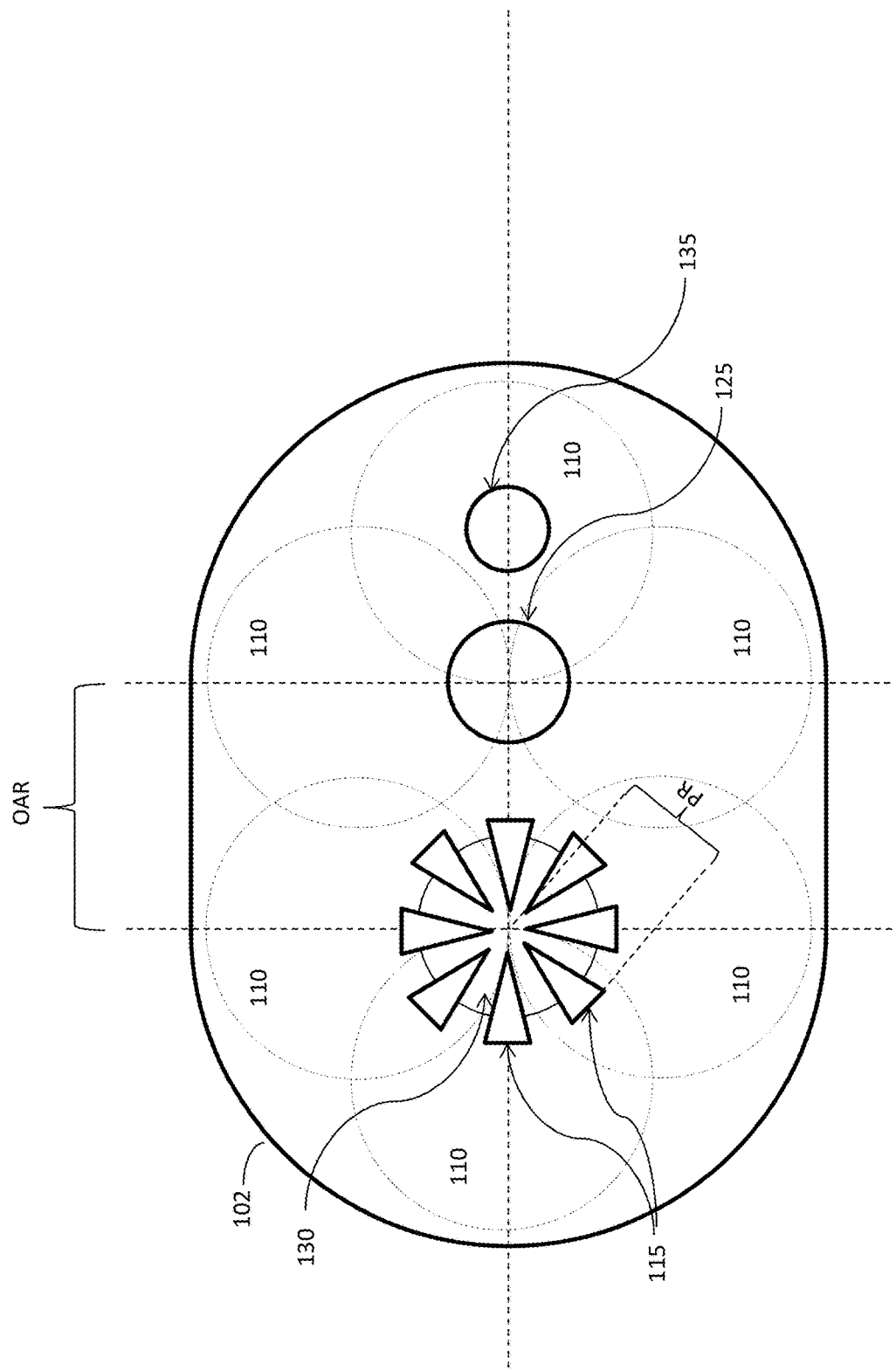
FIGS. 2A and 2B are top views illustrating embodiments for integration of CD SEM, optical microscope and nanoprobe.

FIG. 2A illustrates a top view of the embodiments of either FIGS. 1A-1C, demonstrating how wafer 10 may be placed at different locations to enable imaging any ORI within the wafer by the optical microscope 125, ion gun 135, SEM 130, and nanoprobes 115. In FIG. 2A embodiment, the plurality of nanoprobes 115, are attached to the ceiling to be arranged around the optical axis of the SEM. In this manner, each of the nanoprobes 115 can be placed within the field of view and the optical axis of the SEM. Although not a requirement, in this specific example, the arrangement of the plurality of nanoprobes 115 is symmetrical about the SEM optical axis. Specifically, in some disclosed embodiments the plurality of probes is arranged according to rotational symmetry. For example, in the illustration of FIG. 2A, eight nanoprobes are arranged at a rotational symmetry of 45°. That is, if the entire nanoprobe arrangement is rotated 45° about the optical axis of the SEM, one obtains the exact same arrangement again, which is generally referred to as Order 8 or eight-fold rotational symmetry. In a similar manner, if only four nanoprobes are used, a 90° rotational symmetry may be obtained, for a four-fold rotational symmetry. Of course, a 45° symmetry encompass within it a 90° symmetry, a 180° symmetry, etc. That is, a higher order rotational symmetry encompasses within it a lower order. Thus, in the embodiment shown in FIG. 2A, the nanoprobe arrangement may be rotated 45°, 90°, 180°, about the SEM optical axis and the same arrangement would be obtained.

Also, in one embodiment all of the nanoprobes are placed at the same diameter distance from the SEM optical axis, while in other embodiments nanoprobes at 90° or 180° symmetry to each other are placed at the same diameter distance from the SEM optical axis, while neighboring probers at 45° symmetry may be at different diameter distance from the SEM optical axis.

As indicated in FIG. 2A, the optical axis registration (OAR) between the optical axis of the optical microscope and the SEM is fixed mechanically. Additionally, a fixed mechanical probe registration (PR) is generated between the base of each prober and the optical axis of the SEM. Of course, the probe fork may move the probe tip to various locations within the probe field of view, but since such movement is registered to the base of the probe, by referencing the fixed registration between the base of the probe to the SEM optical axis, it is possible to generate the registration between the probe tip to the SEM optical axis.

Figure 2B:
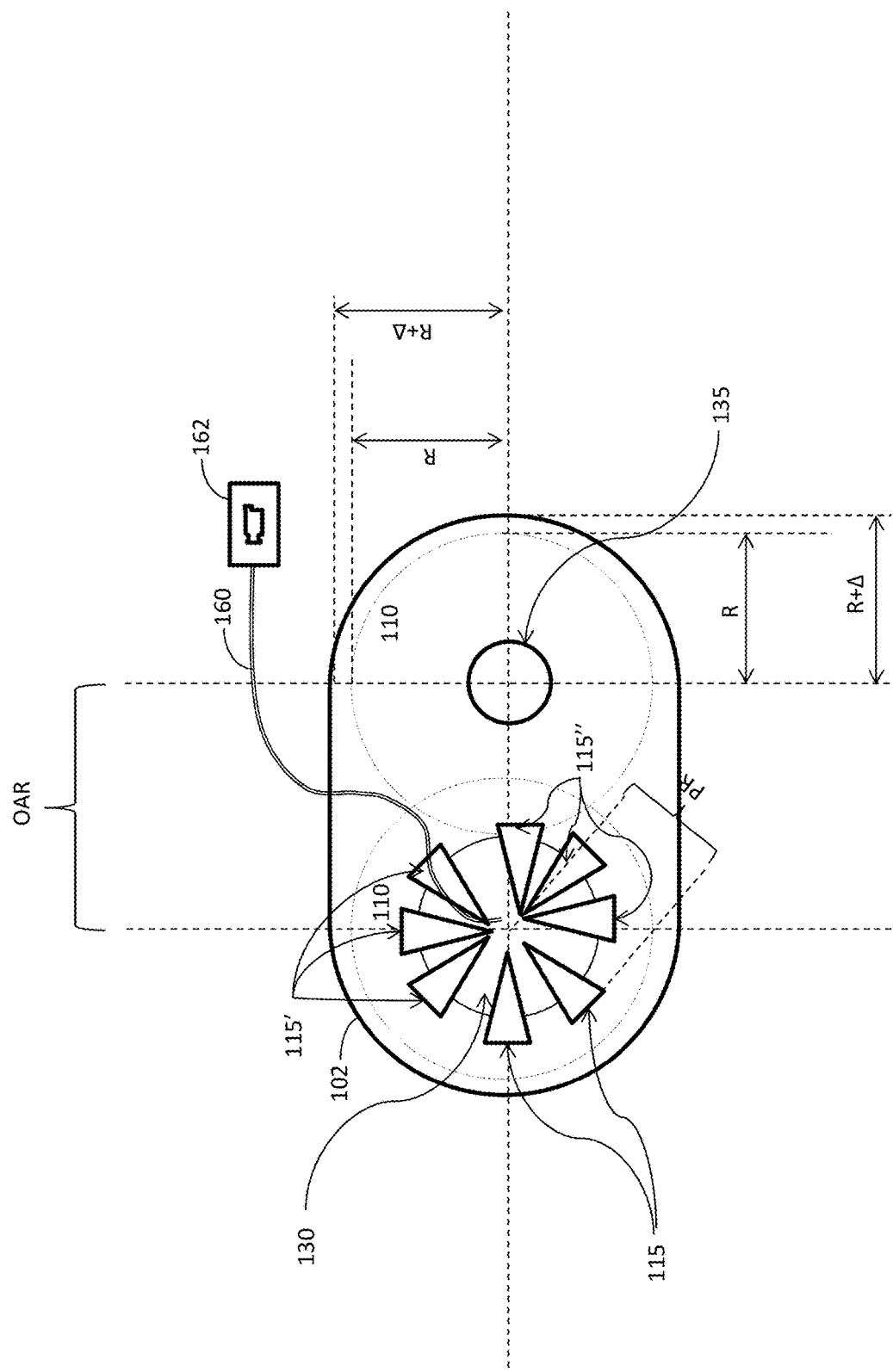

FIG. 2B illustrates a similar embodiment to that of FIG. 2A, except that a rotating stage is used. As is shown, this enables the vacuum chamber 102 to be significantly smaller than that in FIG. 2A, since every point on the wafer may be placed under the optical axis of either microscope by simply rotating the wafer and extending the edge of the wafer no more than one radius away from the optical axis of either microscope. That is, when the wafer radius is designated as R, the sidewall 102 of the vacuum chamber extends to a distance proportional to R, i.e., R+Δ, wherein Δ is a margin of safety to avoid the wafer's edge hitting the sidewall 102. That is, the distance equals the wafer radius plus a safety distance that is a small fraction of the wafer radius.

FIG. 2B illustrates another feature that may be used on any of the disclosed embodiments. As shown in FIG. 2B, the nanoprobes are arranged asymmetrically around the optical axis of the SEM. Additionally, the nanoprobes are arranged in groups or clusters. For example, nanoprobes 115' form one cluster and nanoprobes 115" form another cluster, while nanoprobes 115 are not clustered. The clustering may be configured to provide efficient landing of the tips on specific geometrical structures. For example, cluster 115' may be configured to enable efficient landing on a gate, drain and source of a transistor. On the other hand, individual nanoprobes 115 may be used to land on a common potential line, e.g., a ground or Vdd line.

FIG. 1B illustrate another embodiment that is rather similar to that of FIG. 1A, except that a stage support 103 is attached to the ceiling 104, and the stage is mounted onto the stage support 103. In such a configuration, stage support 103 may be fixedly attached to the ceiling 104, or may be movably attached via a bearing 107. For example, the bearing 107 may enable linear movement in X-Y, while stage 105 may move in elevation Z and rotation Θ. In the configuration of FIG. 1B, since the stage support 103 is attached to the ceiling, there's an improved registration and stability between the position of the stage relative to the ceiling 104, and therefore to the optical axis of the microscopes.

FIG. 1C illustrates yet another embodiment, wherein the tester chamber is divided into vacuum volume and atmospheric volume. Specifically, in the embodiment of FIG. 1C, the stage 105 is attached to the ceiling via air bearing 107. The stage 105 is has a flat bottom part 152 and a vertical wall part 154, mating to the air bearing 107 at its upper end. The bottom part, the vertical wall 154, and the ceiling 104 form a vacuum volume VC. Conversely, the area outside of the stage 105 remains in atmospheric pressure designated AC. The air bearing 107 enables the stage 105 to move in X-Y with respect to the ceiling 104, thereby moving the wafer, while maintaining vacuum inside the vacuum volume VC separated from the atmospheric environment in the atmospheric volume AC. A chuck is mounted onto the bottom part 152 of stage 105.

Also shown in the embodiment of FIG. 1C is the ability to reduce the size of the vacuum section by using fiber optics 160 in conjunction with optics and camera 162 to provide an optical microscope. The entry end of the fiber optics 160 may be placed in close proximity to the exit of the ebeam.

A fast (a few seconds) and safe (nN force level) probe landing on the selected point on the wafer is achieved, in one embodiment, using laser-free landing force control based on a miniature tuning fork force (TFF) sensor. Other methods of force control (e.g., probe bending or vibration monitoring using laser, deposited piezolayers or crystalline piezoelements, etc.) can be used as well. In one example, laser illumination is used to identify landing on target. Specifically, laser or other light source 168 may illuminate the fork via fiber 164, and the reflection may be collected and sensed by a light sensor, such as camera 162, or other light sensors. When he tip lands on the target and touches the sample, the opposing force from the sample would cause a slight bending of the fork, thereby changing the direction of light reflecting from the fork. The light sensor would sense the change in reflection, thereby indicating that the tip has landed on the sample.

According to another example, the frequency of vibration of the nanoprobe fork can be used to sense tip landing on the sample. The nanoprobe fork would have a natural resonant frequency. Similarly, the wafer on the stage would have a natural resonant frequency, which is much smaller than the fork resonant frequency. When the tip lands on the sample, the contact would cause the vibration frequency of the tip to change. By sensing this vibration change the system determines the landing of the tip on the sample. The frequency may be monitored using a tuning fork, a laser, etc.

According to yet another embodiment, the tip landing is identified by sensing the electrical potential or current on the nanoprobe. For example, a potential may be applied to the prober. When the tip lands on a conductive part of the sample, current will start to flow from the tip to the sample. The system senses this conductance of electricity in the probe and determines that a landing has occurred.

The target location for the electrical testing is determined by imaging the ROI on the wafer using the SEM column. In some embodiments, such as that illustrated in FIGS. 1A-1C, the probes are made to move above, but very close to the surface of the wafer until they arrive above their target. Then the probes land directly on the probe targets, thus avoiding dragging the probes over the surface of the wafer and damaging the wafer, the probe, or both. Present advanced process technology provides flatness less than a few microns across wafers of various sizes, e.g., 300 mm wafers. Our experience has found that probes are moved safely above the wafer at heights greater than 10 microns. By flying above the wafer at safe 20 um, the surface approach time of probes is about 2 seconds. The above estimate is done using sequential surface approach steps of 0.1 um and conservative contact force evaluation time (between the steps) of 0.01 sec. The TFF sensor can be used as a very fast probe-surface touch detector. The touch detection is based on shift of frequency or/and amplitude of TFF sensor oscillation which is extremely sensitive to probe proximity to surface. The most gentle, so-called "non-contact" mode of AFM that can be used for in-line fab operation is using principle of surface proximity detection, e.g., the measurement of amplitude of cantilever oscillation. Therefore, the TFF approach guarantees fast and damage free probe landing on any surface with probe-sample force similar to force of "non-contact" mode of AFM.

Another problem solved by disclosed embodiments is enabling low nm/min system mechanical and thermal drifts. The SEM column delivers high quality two-dimensional "drift-free" images and sub-nm reproducible measurements. However, in standard SEM, e.g., CD SEMs, MAM (move-acquire-measure) time is a few seconds. Realistically, in-line nanoprobe MAM time is likely to be about 60 seconds, i.e., 30× greater than CD SEM MAM times. Accordingly, drift of the in-line wafer level nanoprobe system must be 30× less than the SEM drift to deliver the same level of total probe-wafer shift during measurements.

To achieve the necessary requirements on accuracy of probe landing and its position maintenance (for contacts of 7-15 nm in size) embodiments of the invention yield a total drift of about a few nanometers per minute. This extremely low drift is immediate without any delay right after the moment of an abrupt stop of the high speed heavy 300 mm stage at the point of interest.

Once the stage is stopped to present an ROI to a microscope, the rigid connection designed for minimal drift of three main components of the system (the column, wafer and probes) helps maintain column-wafer and column-probe co-registration. The low clearance of the stage design minimizes vertical (Z) and lateral (XY) components of wafer-probe drift. The industry experience is that even near "ideal" design of large 300 mm wafer systems cannot eliminate nanometer scale mechanical and thermal drift(s). For example, the length of a 0.4 m piece of the "best" available today material with the minimal thermal expansion of 1E-6 $K^{-1}$ changes its length by 40 nm with temperature drift of only 0.1° K. That means that even with near ideal system design and temperature control, drift of several nanometers occurs during the contact time needed for probing. To address this situation active column-wafer-probe drift compensation is implemented for a nanometer level system drift control.

The column-wafer drift in one embodiment is compensated using real time e-beam position correction. Information about drift of the column vs. the bottom of stage (i.e., the wafer) is collected using optical quadrant sensors (OQS) 120 distributed around the bottom of stage 105 perimeter (FIGS. 1A-1C and 3). A similar arrangement is provided for column-probe alignment using OQS 121. A picometer scale co-alignment of two objects in three-dimensions can be achieved using optical alignment systems similar to that depicted in FIG. 3. FIG. 3 illustrates an embodiment of optical setups for monitoring of probe-column-wafer (OQS 120) and column-probe (OQS 121) co-alignment, wherein a stabilized diode laser (SDL) 340 emits light through lens 342 towards quadrant photodiode OQS 344.

The principle of OQS operation is illustrated by FIG. 4. The difference between the left and right halves of QPD measures the X signal, and the difference between the top and bottom halves yields the Y signal. Vertical motion (Z) is deduced by the sum signal, which is the total light falling upon the four quadrants of the quadrant photodiode. The XYZ signals are used to maintain in-real time co-registration of wafer to column OQS 120 and column to positioners OQS 121. A feature of the OQS used in this invention is that one part of the OQS (QPD 344 in FIGS. 3 and 4) moves freely until the stage is switched to stop (for OQS 120) or the probe tip arrives to the target position (for OQS 121). Once stage or positioner arrive to the target position the QPD part "sticks" to a stationary part of chamber or stage (e.g., ceiling 104) and remains in this position until the measurement is done. In this embodiment the QPD is attached to the ceiling (104) using vacuum force. Other solutions are possible, e.g., spring, mechanical clamp, and other measures. Then, any relative motion between the SDL 340 and the QPD 344 would be detected and measured by the light intensity sensed by the QPD 344 in the four quadrants.

The OQS is an alternative to interferometry based position monitoring. OQS is used in AFM for probe and cantilever vertical position and force control, but OQS was never used for probe-sample lateral drift correction. Modern AFM's have sub-Angstrom (ca. 20-30 pm) vertical position noise level even at very high frequency (a millisecond noise averaging). Thus, nanopositioners based on OQS are capable of high speed (high frequency) sub-nm position monitoring.

The multi-OQS column-wafer drift monitor system detects not only rectilinear drift but also pitch, yaw and roll column vs. wafer drift. Nevertheless, column (or rather e-beam) position correction is rectilinear (three-dimensional). Even so pitch, yaw and roll related drift components are not significant; our testing of various modern wafer transporting systems (stages) has found that maximum wafer misalignment related to all (including the non-rectilinear) combined drift components does not exceed a few microns over the 300 mm wafer span. Therefore, rotation angles should not exceed 7E-5 radians and the corresponding shift of element of 50 nm size ROI does not exceed 0.002 nm. Therefore, rotational components of the column-wafer drift can be neglected.

In FIGS. 1A-1C the OQS (120) components are shown as triangles connected by line indicating optical axis. The OQS (120) is capable of detecting a nanometer scale XYZ (or XY) drift of the stage (the wafer) vs. the top ceiling (i.e., the column). Information collected from several OQS (120) is mathematically evaluated through a computer 140 in real time to calculate an average XYZ (or just XY) drift vector for the ROI. The drift then is corrected using the column e-beam controls (the column vs. wafer drift correction).

Additional OQS (121) are used to report probe(s) drift relative to the ceiling where the SEM column is installed. In FIGS. 1A-1C only four OQS pairs are illustrated. Two OQS (120) are for wafer-column drift monitoring and the other two OQS (121) positioned closer to the column are for column-probe drift monitoring. In other embodiments at least two OQS are provided for wafer-column drift monitoring and one OQS per probe for the probe-column drift monitoring. In one embodiment, eight nanoprobes 115 are used, and eight OQS 121 sensors are provided, one for each nanoprobe. Information from several OQS (all wafer-column OQS 120 and one column-probe OQS 121) provides data for real-time calculations of each probe drift with respect to the wafer. In other words, each probe-wafer drift vector is calculated as a sum of the column-wafer and probe-column vectors. In such an embodiment, probe positioner to column vector is measured, rather than probe to column vector. Positioner-probe drift can be ignored (because of the relatively small size of the probe) or corrected using optional SEM probe-sample co-registration. The real time correction of vertical positioner-wafer drift at nanometer level keeps probe to surface force and, therefore, contact resistance constant. The wafer to positioner (or probe) co-registration is maintained in real time using three-dimensional probe (positioner) motion.

According to another embodiment, drift correction is done using SEM imaging. In this embodiment, during the parametric testing, the controller 140 obtained images from the SEM every given time period. For example, if the entire test requires a probe to contact its target for 30 seconds, then the controller 140 may obtain SEM alignment image every 2-5 seconds. The controller 140 then compares each new SEM image to the prior images to determine whether the image has shifted. If the new image has shifted beyond a prescribed amount, it is determined that a drift has occurred and a correction procedure is executed. According to one embodiment, a correction procedure comprises lifting the tips from their contact targets and moving the tips to correct for the drift, and then re-landing the tips on the previous targets, but in better alignment to compensate for the drift.

According to another embodiment, the test sequence is broken into a plurality of shorter sub-sequences. Then between every sub-sequence, all of the tips are lifted from their contact targets and then re-landed on the targets with renewed alignment. According to yet another embodiment, for each sub-sequence it is determined how many probes are required and the appropriate number of probes is assigned to perform the particular sub-sequence. For each sub-sequence, the tip are lifted from their contact target, but only the tips assigned for the next sub-sequence are re-landed on their targets.

An embodiment of in-line SEM based nanoprobe navigation sequence may proceed as follows. A lithography shotmap to wafer registration is provided, using optical microscope. This information provides the alignment of the various dies on the wafer with respect to the center of the wafer. Also, a specific die optical alignment is provided with accuracy of ±1 um using optical graphic alignment (OGA) structure pattern recognition. This provides the alignment of that specific die to the wafer. The stage may be moved to place the ROI under the SEM column and then stopped. In the embodiments using air bearing, e.g., FIG. 1C, this may be done by deactivating the air bearing and pumping volume between the top and the bottom parts of the stage, to a vacuum level required for SEM imaging. Then a SEM alignment process of the same die with nanometer scale accuracy using secondary graphic alignment (SGA) structure pattern recognition is performed. The additional pattern recognition is in the vicinity of the ROI with an accuracy of ±5 nm using pre-selected on chip feature. The probes are then moved to the ROI or other measurement target.

According to one embodiment, the nanoprobing process comprises the following steps:
(a) Navigate to the ROI using an optical microscope with accuracy of ±1 um;
(b) Stop stage motion, and lock the top and bottom parts, i.e., the traveling and stationary parts, of the stage together;
(c) Continue navigation with SEM to register ROI with accuracy of ±5 nm;
(d) Bring pre-registered probes to the ROI;
(e) Co-register probes and the ROI contacts using pattern recognition;
(f) Land probes on the ROI targets;
(g) Turn on the wafer-column and the column-probe drift monitoring and real time wafer-probe drift compensation;
(h) Using probe positioners adjust probe-wafer force to obtain required contact resistance;
(i) Collect electrical data: active voltage contrast (AVC) or/and current vs. voltage dependencies (I-V) or/and capacitance vs. voltage dependencies (C-V) or/and electron beam absorbed current (EBAC) or/and electron beam induced current (EBIC), or/and electron beam induced resistance change (EBIRCH), or/and other electrical measurements;
(j) Lift the probes;
(k) Asses quality and accept or reject data;
(l) If data rejected repeat steps (e-j).

In the prior art, each individual nanoprobe is moved to its test position independently and sequentially. This is a tedious and time consuming process. However, since all of the probers are already attached inside the chamber and are aligned in registration with the optical axis of the SEM, in disclosed embodiments an improved process is utilized to land the probers. FIG. 5 is a schematic showing a region of interest 500, as obtained from the SEM column by directing an electron beam to scan the ROI and collecting secondary electrons emanating from the ROI. The ROI includes several visible structures 505, some of which may be of interest for probing and some of which may not. According to one embodiment, a cursor 510 is used by a user of controller 140 to designate the targets of interest. According to another embodiment, automatic image recognition is employed by controller 140 to identify the targets of interest. According to yet another embodiment, design data from database 148 is used to help identify the structures of interest. For example the Netlist, which is a list of all the component terminals that should be electrically connected together for the circuit to work, can be used to identify the flow of current in normally operating design and to highlight which elements 505 in the ROI 500 should be connected by that design. Similarly, CAD data that is used to generate the different photoresist masks that generated the layers shown in the ROI can be used to identify which each of elements 505 is.

According to another embodiment, the SEM is used to generate a voltage contrast image, and the voltage contrast image is used to identify the targets. Specifically, according to this embodiment an electrical potential is applied to the wafer. For example, the electrical potential may be applied to the wafer using the wafer support, wherein the wafer support includes an electrode to apply the electrical potential to the wafer. According to another example, one or more of the nanoprobe tips may contact conductive elements within the wafer and apply electrical potential. Then the SEM column is used to scan an electron beam over the ROI and collect secondary electrons emanating from the ROI. The amount of secondary electrons would differ from regions that are at the applied electrical potential and those that are insulated from the electrical potential. Thus, a voltage contrast image is generated from the secondary electrons, wherein regions that are at the applied potential appear at different intensity than regions that are insulated from the electrical potential. The voltage contrast image may then be used to identify targets for nanoprobe tips. According to another embodiment, the voltage contrast image may be superimposed on the SEM topography image or on the CAD image to better identify suitable targets. Additionally, the Netlist can also be used in conjunction with the voltage contrast image to identify suitable targets.

According to yet another embodiment, the generated voltage contrast image is overlaid on a "golden" voltage contrast image or on a voltage contrast image from a neighboring device on the wafer. The regions that have different intensity in the images are selected as proper targets for nanoprobing.

Once all of the targets have been identified and designated, the controller 140 basically has a geometric design describing a collection of points. For example, if all of the elements 505 are to be landing targets, then the collection of points are the points plotted in the Cartesian coordinates of FIG. 5. These coordinates may also be described as a collection of vectors Vi-Vn shown in FIG. 5. The coordinates of the points or vectors may relate to a corner of the ROI or to a particulate alignment element or alignment mark in the ROI. Since controller 140 now has the collection of points and also has the alignment registration between each of the nanoprobes to the optical axis of the SEM, the controller 140 now assign each point of interest to one of the nanoprobes, e.g., the nanoprobe that is within closest reach to the assigned point. The controller 140 can then generate a new set of vectors, each defining the distance and direction an assigned nanoprobe needs to move in order to arrive above the assigned point of interest. The controller may also calculate the motion of the nanoprobes and check to ensure that the collection of motions does not lead to a collision. If a potential collision is detected, the controller changes one or more of the motion vectors to avoid the collision. The controller may then issue a "move" command simultaneously to each of the nanoprobe forks, each having its own assigned movement vector so as to arrive above its assigned landing point. Moreover, according to disclosed embodiments, the controller also operates the SEM to generate images of the ROI in real time, so as to monitor the progress of the nanoprobes motion and provide any corrections to the motion vectors in real time as needed.

According to other disclosed embodiments, as the user designates targets and the controller assign corresponding motion vectors to each prober, the controller accumulates knowledge of the specific geometrical arrangement of the points of interest and generates a library of these geometrical designs. Thereafter, the controller 140 uses image recognition process to attempt to match a design appearing in a new ROI image to one of the designs stored in the library. If a match is found, the controller may then fetch the corresponding motion vectors stored for that particular design and send the motion commands to the nanoprobes.

According to yet another embodiment, a library of points of interest in different ROI's is stored in the database. For example, each new chip design may include a library of landing points for different locations on different ROI's. When a new ROI image is loaded to the system, either the user designates which ROI it is, or the controller 140 may use image recognition to identify the ROI and the points of interest. Then, the controller 140 fetches and sends the motion commands to the nanoprobes. Additionally, as the controller 140 makes real time corrections according to the SEM images, those corrections are accumulate and used to update the stored motion vectors.

As can be seen, an advantage of the above methods is that all of the nanoprobes move to their assigned location simultaneously, and their motion may be monitored and corrected in real time using SEM images.

By implementing the disclosed embodiments, an integrated nanoprobe/SEM tool for wafer testing is obtained, which has multiple advantages. Since the nanoprobes are attached to the same physical plate as the SEM column, an alignment registration can be obtained and stored between the base of each nanoprobe and the optical axis of the SEM. Also, since the nanoprobes are attached to the same plate as the SEM column, the nanoprobe forks may be made of standard length, which add to their stability. Also, since the nanoprobe are attached above the wafer, they may reach any point on the wafer, even if the wafer is 450 mm in diameter. Also, since the nanoprobe are arranged circularly around the SEM column, multiple nanoprobes may be used with a single SEM e-beam. Finally, since the nanoprobes are arranged at a registered location around the SEM column, they may be moved simultaneously to their assigned targets.

Moreover, since the nanoprobes are arranged around the optical axis of the e-beam, the nanoprobes may be used in situ to investigate any anomaly identified by the SEM image. That is, there's no need to move the wafer to a different station and reacquire the anomaly. Rather, the wafer remains in its position and the closest probes are moved into the line of sight of the SEM and landed on the anomaly to investigate it.

According to another feature, illustrated in FIGS. 1A and 1B, an ion gun column is also attached to the ceiling 104. When the areas of interest have been identified, the wafer is moved into position for the ion gun and the ion beam is used to clean the points of interest, especially to remove any oxide layer that has grown since the time of fabrication to the time of inspection. Once the points of interest have been cleaned, the wafer is returned to be positioned under the SEM beam, and the SEM image is used to assist in landing the nanoprobes on the cleaned positions. In other embodiments, the ion gun may be positioned in an adjacent chamber.

The embodiments described above are specific to nanoprobing of semiconductor wafers having electronic devices formed therein. The various features of the invention are implemented using hardware, software, or combination of hardware and software to provide parametric testing of semiconductor devices using nanoprobes. In the following disclosed embodiments, the probed devices may be in a form of devices, microchips or wafer. Generally, when the probed devices are in the form of microchips, they are de-capsulated and sometimes some layers are removed so as to expose contact targets. Conversely, when probing wafers in-line, no modification of the wafer is allowed.

The contact targets (e.g., conductive lines, contact or vias) are used to apply electrical test signals to the device. The various embodiments disclosed below provide improved processes to make proper contact between the nanoprobes and the contact targets. The various embodiments and features are explained with reference to the tester arrangement illustrated in FIG. 6, which may correspond to any of the testers shown in FIGS. 1A-1C when wafers are probed. The processes described may utilize various steps that are automated, semi-automated (i.e., require some user input to execute) or manual (i.e., executed according to directions by a user).

Figure 6:
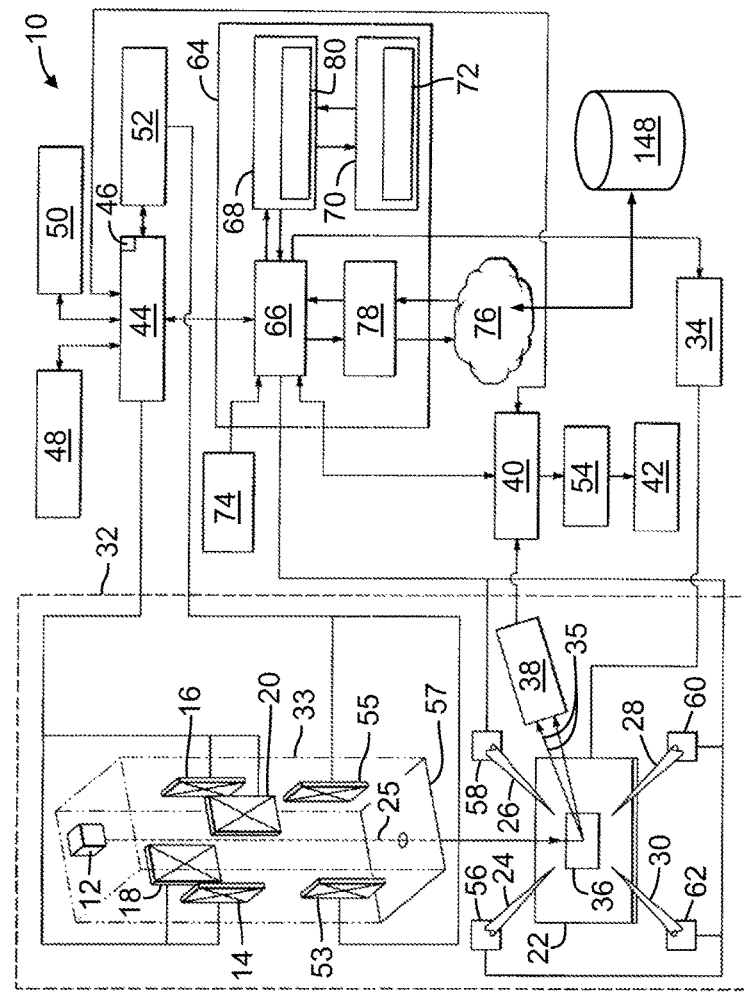
FIG. 6 illustrates an embodiment for integration of CD SEM and nanoprobes, according to one embodiment.

With reference to FIG. 6 and in accordance with an embodiment of the invention, a scanning electron microscope (SEM) nanoprobe 10 includes an electron gun 12, a set of scan coils 14, 16, 18, 20, a sample stage 22, and a set of nanoprobes 24, 26, 28, 30 that are housed inside a vacuum chamber 32. The electron gun 12 includes an anode and cathode (not shown) to which an accelerating voltage is applied to create a relatively large potential difference that extracts an emission current from the cathode and, thereby, generate a primary electron beam 25 by either field emission or thermionic emission. Located inside the vacuum chamber 32 of the SEM nanoprobe 10 is a column 33 that features various condenser lenses, objective lenses, and apertures, which collectively operate as electron optics that focus and collimate the primary electron beam 25 in the travel path from the electron gun 12 to the sample stage 22. The scan coils 14, 16, 18, 20 are also located inside the vacuum chamber 32. The sample stage 22 is movable under the management of a stage controller 34 to situate different regions of interest on a sample 36 within the field of view of the primary electron beam 25. The sample 36 may be a die carrying an integrated circuit, which has been prepared for electrical probing in the SEM nanoprobe 10 to perform root cause failure analysis. Alternatively, the sample 36 may be a wafer carrying multiple product chips.

Although described herein in relation to the use of a primary electron beam 25, a person having ordinary skill in the art will appreciate that the embodiments of the invention may also apply to the use of a focused ion beam containing positive ions, or another type of focused charged particle beam, in conjunction with nanoprobing. A person having ordinary skill in the art will understand the modifications to the SEM nanoprobe 10 required to convert the tool for use with other types of charged particles, such as positive ions. Moreover, device 10 may include both an SEM and an ion beam column, such as, e.g., a focused ion beam, a plasma ion beam, etc. Alternatively, the SEM column may be inside vacuum chamber 32, while the ion beam column may reside in an adjacent vacuum chamber.

The scan coils 14, 16, 18, 20 are disposed within the column 33 between the electron gun 12 and the sample stage 22. The scan coils 14, 16, 18, 20 are energized to scan the primary electron beam 25 in two dimensions across a region of interest on the surface of the sample 36. To that end, one set of scan coils 14, 16 is configured to deflect the primary electron beam 25 relative to the surface of the sample 36 in a first direction and the other set of coils 18, 20 is configured to deflect the primary electron beam 25 relative to the surface of the sample 36 in a second direction orthogonal to the first direction.

When irradiated by the primary electron beam 25, secondary electrons 35 are emitted from the sample 36. The secondary electrons 35 are produced by interactions of the primary electron beam 25 with atoms at, or near, the surface of the sample 36. The secondary electrons 35 are collected by a secondary electron detector 38 located inside the vacuum chamber 32. Typically, the secondary electron detector 38 includes a phosphor or scintillator that converts the collected secondary electrons 35 into flashes of light and a photomultiplier that converts these flashes of light into amplified electrical signals. The secondary electron detector 38 is positively biased to attract the secondary electrons 35.

The amplified electrical signal output from the secondary electron detector 38 is converted by an image display control unit 40 to video signals, which are supplied to a video display unit 42 for display as a secondary electron image of a field of view on the sample 36. The secondary electron image contains a two-dimensional intensity distribution or map of the secondary electron emission prompted by the interaction of the primary electron beam 25 with the surface of the sample 36. The intensity of the individual pixels in the secondary electron image displayed on the video display unit 42 depends on the number of secondary electrons 35 from the corresponding location on the sample 36 that reach the secondary electron detector 38. Alternatively, secondary electron image from the sample 36 may be digitized into discrete pixels before display on the video display unit 42 and saved in a digital format in the storage 70 of the controller 64. The number of secondary electrons 35 emitted from any point on the sample 36 depends on the type of material exposed to the primary electron beam 25 and to the topography of the sample.

The travel path of the primary electron beam 25 passes through the scan coils 14, 16, 18, 20 in the column 33 of the SEM nanoprobe 10. The scan coils 14, 16, 18, 20 cooperate to deflect the primary electron beam 25 in the x- and y-axes so that, downstream from the scan coils 14, 16, 18, 20, the primary electron beam 25 scans in a pre-set pattern relative to a surface area on the sample 36. An electron beam control unit 44 is configured to monitor and control deflection of the primary electron beam 25 by the scan coils 14, 16, 18, 20 with applied excitation voltages. To that end, the electron beam control unit 44 is configured to generate the preset pattern by enabling raster scans of the primary electron beam 25, vector scans of the primary electron beam 25, beam dwell or sweep timings, and beam blanking.

The SEM nanoprobe 10 includes various control modules that are used to control and manage the primary electron beam 25, as well as operation of the sample stage 22, secondary electron imaging, and electrical probing. For raster scans, the scan coils 14, 16, 18, 20 may be supplied with a two-dimensional scan signal having an amplitude corresponding to the final magnification from a scan signal generator circuit 46 in the electron beam control unit 44. A raster control module 48 of the electron beam control unit 44 is configured to indicate a starting corner of a raster set, a sweep rate (or a dwell and a step rate), initial and terminal positions of the raster scan lines, the spacing between successive raster scan lines, and the height of raster boxes to the scan signal generator circuit 46. A vector control module 50 of the electron beam control unit 44 is configured to indicate a vector start point, a vector direction, a vector terminal point, and a sweep rate for vector scan lines of the primary electron beam 25 to the scan signal generator circuit 46.

A beam blanking control module 52 of the electron beam control unit 44 is configured to set start and stop locations for blanking of the primary electron beam 25 when moved across the sample 36 in either raster scans or vector scans. The beam blanking control module 52 may apply a voltage to a set of deflection plates 53, 55 to deflect the primary electron beam 25 laterally onto a downstream aperture stop 57 in the column 33, thereby blanking the beam 25 so that the primary electrons are not incident on the sample 36. The primary electron beam 25 is restored by removing the voltage from the deflection plates 53, 55 so that the primary electron beam 25 again permitted to travel to the sample 38 through an opening in the aperture stop 57. When the beam blanking control module 52 is operated to blank the primary electron beam 25, the secondary electron emission from the sample 36 ceases as the primary electron beam 25 is blocked from traveling to the sample 36.

In a raster scanning mode, the movement of the primary electron beam 25 across the sample 36 is divided into a sequence of horizontal strips known as scan lines. Each of the scan lines is implemented by causing the scan signal generator circuit 46 in the electron beam control unit 44 to operate the scan coils 14, 16, 18, 20 to deflect the primary electron beam 25 at fixed increments (or as a continuous sweep) along a linear path parallel to one axis from a start point to an end point. The primary electron beam 25 is permitted to dwell for a fixed dwell time at each intervening point between the start and end points. At the end point of each scan line, the position of the primary electron beam 25 is incrementally advanced along a second axis orthogonal to the first axis. The primary electron beam 25 may return to the start point of the first axis to initiate the net successive scan line, or the primary electron beam 25 may be deflected in the reverse direction from the end point back toward the start point. This process continues until all raster scan lines have been traced on the sample 36 and the primary electron beam 25 has dwelled at all points in each scan line.

The image display control unit 40 of the SEM nanoprobe 10 manages the operation of the video display unit 42. The secondary electron image 94 (FIG. 8) is periodically refreshed on the video display unit 42. The image display control unit 40 closely synchronizes the secondary electron image 94 displayed on the video display unit 42, or stored in a display buffer 54 and periodically forwarded to the video display unit 42, with the deflections of the primary electron beam 25 caused by the electron beam control unit 44 and scan coils 14, 16, 18, 20. The resulting secondary electron image 94 on the video display unit 42 is therefore a distribution map of the intensity of secondary electrons 35 being emitted from the scanned area on the sample 36 and is intimately linked thereto.

The image display control unit 40 has the capability to superimpose a CAD layout on the secondary electron image 94 on the video display unit 42 and capture such operator-defined information for control of the electron beam by the electron beam control unit 44. The image display control unit 40 includes a compensation control for SEM magnification to scale images for the electron beam field of view and to scale masks, zones, or CAD layout. Using the secondary electron image 94, the nanoprobes 24, 26, 28, 30 are maneuvered by motorized micromanipulators 56, 58, 60, 62 to position the tips of the nanoprobes 24, 26, 28, 30 in direct contact with conductive features on the sample 36. During this positioning process, the location of the contacts on the sample 36 and, optionally, the real-time position of the probes 24, 26, 28, 30 are monitored using the secondary electron image 94. When the tips of the probes 24, 26, 28, 30 are properly positioned, electrical test signals are directed from the probes 24, 26, 28, to the conductive features on the sample 36. As appreciated by a person having ordinary skill in the art, the exact number of probes 24, 26, 28, 30 associated with the SEM nanoprobe 10 may differ from the representative number depicted in FIG. 6, and may range from one (1) to eight (8), or even more than eight, according to the type of electrical test measurement.

The operation of the SEM nanoprobe 10 is coordinated and controlled by a controller 64, which is electrically coupled with stage controller 34, image display control unit 40, and electron beam control unit 44. The controller 64 includes a processor 66 and a memory 68 coupled with the processor 66. Processor 66 may represent one or more individual processors (e.g., microprocessors), and memory 68 may represent the random access memory (RAM) devices comprising the main storage of controller 64, as well as any supplemental levels of memory, e.g., cache memories, non-volatile or backup memories (e.g., programmable or flash memories), read-only memories, etc. In addition, memory 68 may be considered to include memory storage physically located elsewhere in controller 64, e.g., any cache memory in the processor 66, as well as any storage capacity used as a virtual memory, e.g., as stored on a mass storage device 70. The mass storage device 70 may contain a cache or other data storage, which may include one or more databases 72. The databases 72 may, for example, contain CAD navigation data and CAD layout data for use in practicing embodiments of the invention.

Controller 64 also typically receives a number of inputs and outputs for communicating information externally. For interfacing with a user or operator, controller 64 typically includes a graphical user interface 74 with one or more input devices, such as a keyboard, a mouse, a trackball, a joystick, a touchpad, a keypad, a stylus, and/or a microphone, among others, as well a display, such as a CRT monitor, an LCD display panel, and/or a speaker, among others, or other type of output device, such as a printer. The interface to controller 64 may also be through an external terminal connected directly or remotely to controller 64, or through another computer communicating with controller 64 via a network 76, modem, or other type of recognized communications device. Controller 64 communicates on the network 76 through a network interface 78.

Controller 64 operates under the control of an operating system 80 and executes or otherwise relies upon various computer software applications, components, programs, objects, modules, data structures, etc. In general, the routines executed to implement the embodiments of the invention, whether implemented as part of an operating system or a specific application, component, program, object, module or sequence of instructions will be referred to herein as "computer program code", or simply "program code". The computer program code typically comprises one or more instructions that are resident at various times in various memory and storage devices in a computer, and that, when read and executed by one or more processors in a computer, causes that computer to perform the steps necessary to execute steps or elements embodying the various aspects of the invention.

The SEM nanoprobe 10 may provide a user with the ability to program the controller 64 with instructions and settings for the various embodiments used to test various regions of the device. For example, the user may supply instructions for selecting the contact targets for the nanoprobes via the user interface 74. Alternatively, the instructions for the selection of targets and selection of test protocols may be received remotely, such as from another computer that is operatively coupled to controller 64 through network 76, for example.

Figure 7:
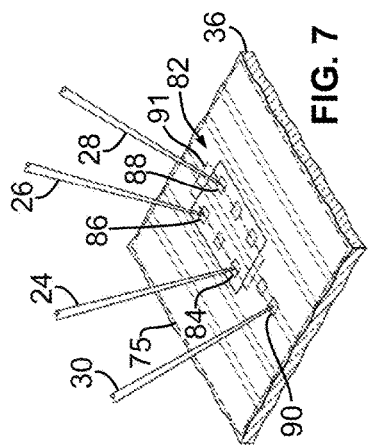
FIG. 7 is a schematic illustrating a plurality of nanoprobe tips contacting a device under test.
Figure 8:
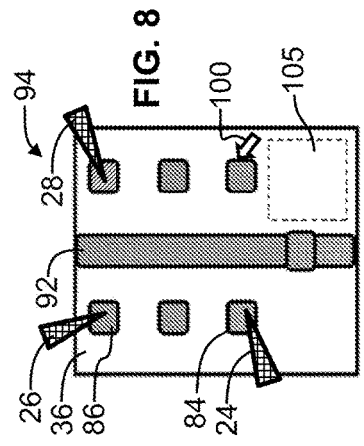
FIG. 8 illustrates an SEM image of nanoprobe tips contacting a DUT.

FIG. 7 is a sketch illustrating a plurality of nanoprobe tips 24, 26, 28 and 30 contacting various targets on device 36. The device structure 82 may be, for example, a field effect transistor or a memory cell containing several field effect transistors, etc. The tips of the probes 24, 26, 28, 30 are placed in contact with the terminals or contact targets 84, 86, 88, 90 for electrical characterization of the device structure 82 of the device under testing (DUT). FIG. 8 illustrates an SEM image of a region of interest ROI of the device 36, showing some of the contacts and some of the nanoprobe tips. Also shown in FIG. 8 is a cursor 100, that may be used by the user as will be described in more details below. For clarity, not illustrated in FIG. 8 is the ability to superimpose a CAN design image corresponding to the ROI.

According to embodiments of the invention, a database 148 may be interrogated by the processor 66 via network 76.

Alternatively, appropriate data from the database is sent to or downloaded onto the memory 68. The data in database 148 may take the form of CAD design data, a Netlist, or both. Conversely, the CAD design data and Netlist may be stored on two different databases that may be connected independently to network 76. CAD design data describes the geometrical shape of various layers on the integrated circuit, while Netlist describes the connectivity of an electronic design, that is, a single Netlist is a list of all the component terminals that should be electrically connected together for the circuit to work. So, while the CAD design data provides visual image that may be compared to and registered/aligned to the SEM image, the Netlist provides electrical connectivity data relating to various elements shown in the SEM image. Thus, for example, a Netlist may indicate whether and when contact 84 should be electrically connected to contact 86. Such information is not provided by the CAD design data or the SEM image. Knowledge of this connectivity helps in determining which contact targets are appropriate for performing which tests. For example, if the Netlist indicates that contacts 84 and 86 should be electrically connected, which is not visible to the SEM since the connection may be in lower, obscured, layers of the device, then one nanoprobe may apply potential to contact 84 and another nanoprobe can be used to check the potential on contact 86, to verify that they are indeed electrically connected.

According to another embodiment, the SEM is used to generate a voltage contrast image, and the voltage contrast image is used to identify the targets. Specifically, according to this embodiment an electrical potential is applied to the wafer. For example, the electrical potential may be applied to the wafer using the wafer support, wherein the wafer support includes an electrode to apply the electrical potential to the wafer. According to another example, one or more of the nanoprobe tips may contact conductive elements within the wafer and apply electrical potential. Then the SEM column is used to scan an electron beam over the ROI and collect secondary electrons emanating from the ROI. The amount of secondary electrons would differ from regions that are at the applied electrical potential and those that are insulated from the electrical potential. Thus, a voltage contrast image is generated from the secondary electrons, wherein regions that are at the applied potential appear at different intensity than regions that are insulated from the electrical potential. The voltage contrast image may then be used to identify targets for nanoprobe tips. According to another embodiment, the voltage contrast image may be superimposed on the SEM topography image or on the CAD image to better identify suitable targets. Additionally, the Netlist can also be used in conjunction with the voltage contrast image to identify suitable targets.

According to one embodiment, an automatic target acquisition is achieved by the processor 66. According to one example, the processor executes a process wherein the processor operates the SEM to generate an SEM image of an ROI. Then the processor compares the SEM image to CAD design data to identify the location of the ROI with respect to the remainder of the DUT. Once the processor identifies the location ROI, it identifies elements within the ROI, e.g., contacts 84 and 86 and line 92. The processor then interrogates the Netlist to determine which elements within the ROI should be contacted by a nanoprobe to perform electrical tests. Once the processor determines which elements should be contacted, the processor assigns a nanoprobe to each of the elements. Incidentally, the assignment of nanoprobe may also be performed by a user operating the cursor 100 and clicking on different elements and probers. Once the nanoprobes have been assigned to their respective elements, the processor 66 calculate motion vector for each nanoprobe and check to ensure that the motion according to the motion vectors does not result in collision of the nanoprobes. When no collision is detected, the processor 66 issues a motion vector to each nanoprobe to move its tip towards the assigned element. Each of the above steps may be performed automatically, semi-automatically (i.e., with some input from a user) or manually.

According to further embodiments, once the processor obtains the CAD design data for the ROI, the processor select a parametric test from a library of parametric tests, depending on the design indicated by the CAD design data. For example, the processor 66 may select a different parametric test depending on whether the CAD design data indicates that the ROI encompasses an SRAM, a diode, a memory cell, etc. Additionally, depending on the CAD design data, the processor may select the number of nanoprobes to be used in the parametric test. Alternatively, the test is selected according to information received from the Netlist.

As indicated previously, there are times when the sample needs to be transferred to another device to further investigate a particular element within a sample, or to prepare the sample for further investigation. However, in today's technology the elements are of nano-size and are very difficult to find, even using the most advanced particle microscopes. Therefore, according to one embodiment, when the SEM acquires a target of interest, and it is determined that the sample may need to be investigated further, the processor follows the following process. The processor determines a safe region within the ROI. The safe region may be determined by a user indicating the location, e.g., using the cursor 100, or by the processor performing the determination automatically, semi-automatically, or in conjunction with interrogation of the CAD design data. A safe location is defined as a location that is not part of the electrical circuitry. For example, it may be an insulation area, such as area 105 shown in FIG. 8. The processor then send motion vector to one of the nanoprobes to move towards the safe area. Once the nanoprobe arrives at the safe area, the processor issues instructions to the nanoprobe to scratch a mark in the same area. For that purpose, according to one embodiment, one of the nanoprobe is fitted with a specialty tip, e.g., a hardened tip made of, e.g, diamond or silicon-carbide (SiC), and it is the only nanoprobe used for scratching the samples. Thus, for example, apparatus 10 may include several nanoprobes having conductive tips, e.g., made of tungsten, while also include one or more nanoprobed having hardened tips that may be made of an insulator and which are not used for parametric testing. Alternatively, one of the conductive tip nanoprobe may be used for scratching, although it may require earlier replacement due to dulling of the tip. The scratch mark then may be used by other particle or optical microscope to easily find and identify the ROI and/or the target within the ROI.

From the above described process, an embodiment of the invention may include a method for investigating a sample, which includes imaging a region of interest within the sample, identifying a safe location for marking the ROI, using a nanoprobe to scratch a mark in the safe location, and transferring the sample to another station, e.g., a forced ion beam, and acquiring the ROI at the next station by searching for the scratch using a microscope, e.g., an optical or a particle beam microscope.

The probing of a DUT may include a step of marking further regions of interest using a hardened probe. According to this embodiment, a combination of scanning electron microscope (SEM) and nanoprobes is used to probe the DUT by following the steps of: obtaining an SEM image of a region of interest (ROI) in the DUT; obtaining a CAD design image of the ROI; registering the CAD design image with the SEM image to identify contact targets; obtaining an electrical design corresponding to the contact targets and using the electrical design to determine which of the contact targets should be selected as test target; navigating nanoprobes to land a nanorpobe on each of the test targets and form electrical contact between the nanoprobe and the respective test target; and using a nanoprobe having a hardened tip to make a mark on any ROI requiring further investigation. The electrical design may be in the form of a Netlist.

According to another embodiment, the following method is performed to overcome natural drift in the system e.g., drift of the sample or parts the system due to thermal variations. In one example, once the type of test to be performed is determined, the time period required to perform the entire test is determined. The time period is then compared to a threshold period. The threshold period may be calculated according to expected or potential drift time. For example, depending on the material of the sample, it may be determined that within five seconds the drift may be sufficiently large so as to strain the tip contacting the contact element or cause the tip to slide away from the contact element. Thus, the threshold period may be set to four or five seconds. If it is determined that the test period is larger than the drift period, the test is broken into several sub-tests, each requiring a sub-period of the total test period. For example, if it was determined that the entire test would take 30 seconds to complete, the test may be broken into six sub-tests, each requiring five seconds to complete. Then between each sub-test, the tips are raised from their contact element, the ROI imaged, the alignment of the nanoprobes to their respective landing targets is corrected if a drift was detected, and the tips are re-landed on their respective contact elements for the next sub-test.

In the above method, it may be that each sub-test requires a different number of nanoprobes, since each sub-test may test different elements within the ROI. In such a case, for each sub-test the method proceed by identifying the number of contact elements participating in such sub-test. Then the method proceeds by assigning nanoprobes to those contact elements. Then, for each sub-test, only a subset of the nanoprobes are landed on the assigned elements, as required for that particular subtest. At the end of each subtest, the landed nanoprobes are lifted off the contact elements and the next subset is landed on the next set of contact elements to perform the next sub-test.

Another embodiment of the invention helps in shortening the time to target acquisition by a-priory knowledge of the expected geometrical arrangement of the contact elements for the nanoprobes. For example, with respect to the illustration of FIG. 7, the design structure 82 may be repeating many times throughout the sample. It may also be repeated in other samples of the same or similar chip design. Therefore, according to this embodiment, the design is stored in the memory storage, e.g., storage 70 or database 148, together with associated geometrical shape of the contact elements and motion vectors for the assigned nanoprobes. For example, the image of element 82 may be stored together with a geometrical shape mimicking a number 6 as appearing on a die, and associated motion vectors, each with its assigned nanoprobe. Then, when the specific shape is recognized in the field of view of the SEM, the pattern may be immediately recognized and the motion vectors sent to the assigned nanoprobes.

Figure 9:
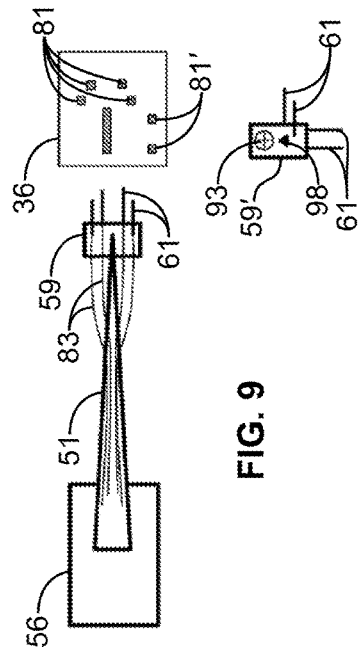
FIG. 9 illustrates an embodiment of a nanoprobe head having multiple nanoprobe tips at a fixed orientation.

On the other hand, FIG. 9 illustrates another embodiment specifically tailored for testing repetitive pattern arrangements. In FIG. 9, the nanoprobe comprises a micromanipulator, such as, e.g., manipulator 56. A probe arm 51 is attached at one end to the manipulator 56, such that the manipulator can move the arm 51 according to the motion vectors. A probe head 59 is attached at the other end of the arm 51, and is sometimes referred to herein as nanoprobe card. The probe head 59 has a plurality of probe tips 61 that are fixedly attached to the probe head 59. The probe tips 61 are attached to the probe head 59 at a single specific orientation such as to correspond to a specific geometry of contact elements. In the example of FIG. 9, the four probe tips 61 are attached to the probe head 59 at a fixed orientation that corresponds to the arrangement of contact elements 81 of DUT 36. Since the probe tips 61 are fixedly attached to the probe head 59 in one single orientation, this particular probe head may be used only for tests that utilize contact elements 81. Note, however, that other standard nanoprobes in the system can be used to contact other contact elements if needed. However, for any device having contact elements arranged as element 81, this particular probe head can be used. This arrangement has the advantage of being able to land four nanoprobes simultaneously using a single actuator 56.

In the embodiment of FIG. 9, four separate leads 83 are provided, one for each of the probe tips 61. In this manner, each probe tip can deliver different current or signal to its contact element separately. Of course, if all of the contact points are to be energized with the same current or test signal, one lead 83 can be used to deliver power to the four tips 61.

Also illustrated in FIG. 9 is the provision of replacement probe head 59'. Visible in FIG. 9 is the provision of quick disconnect coupler 98 on the probe head. A corresponding disconnect coupler is provided on the 52, but is not visible in the illustration of FIG. 9. The provision of disconnect coupler enables replacement of the probe heads for testing different targets or for running different tests.

As shown in this example, replacement probe head 59' has two probe tip designed to contact two of the lower four contact elements 81 and two probe tips 61' oriented to land on contact elements 81'. Thus, according to one embodiment, the probe heads are removable from arm 51 and exchangeable with other probe heads. Also, according to one embodiment, each DUT has a set of probe heads 59 fabricated specifically for test elements to be found on the particular DUT. Thus, when a DUT is selected for testing, the set of probe heads assigned to the particular DUT is determined and mounted on respective probe arms.

According to another embodiment, also illustrated in FIG. 9, an alignment target is provided on the top surface of the probe head. This is shown on probe head 59' only, but can be provided on any probe head. The alignment target is configured to be visible by an SEM or other particle microscope. This may be done using varying topography or material. For example, the probe head 59 may be made of ceramic material, while the target 93 may be a deposited or embedded conductor, such as gold. When the manipulator 56 moves the arm to align the probe tips to land on their target, the SEM may be used to image the probe head and use the alignment target to ensure that all of the probe tips will indeed land on their contact element.

In the embodiments described above, after the probe tips are landed on their respective targets, the controller sends test signals to each of the probers. The test signals may be a simple positive, negative, or ground potential, or may actually be a varying analog or digital signal, or a combination of these. As those signals are transmitted to the probe tips, regions and elements in the circuit that have conductive path to the test signals at any of the probe tips, will assume that electrical potential. It can be said that the element or region is at the test signal potential. During that time, the SEM column is operated to scan an electron beam over the ROI and collect secondary electrons emanating from the ROI. The secondary electrons correlate to the potential of each region or element within the ROI, and can be used to generate a probe voltage contrast image. This probe voltage contrast image can be compared to a voltage contrast image generated before the tips were landed on the targets, to thereby investigate defects in the electrical circuit.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", or variants thereof are used in either the detailed description or the claims, such terms are intended to be inclusive in a manner similar to the term "comprising." It is also understood that features of the embodiments of the invention are not necessarily shown to scale in the drawings.

The steps described for the disclosed processes may be manual, partially automated or substantially automated. For example, manual steps may substantially rely on user input. Partially automated embodiments of the processes may automatically perform a subset of the actions and/or decisions of the process, while relying on a user input for the remainder of the actions/decisions. Automated aspects of partially automated embodiments may include process initiation, process performance, process monitoring and/or adjustment (e.g., time, power, speed, force, etc.), process termination, and/or process errors, among others. Substantially automated embodiments of the processes may substantially rely on automated robotics and/or other machinery or apparatus, and/or substantially automated computing hardware and/or software, such that, e.g., the selection of probes during process may be performed in the substantial absence of user input. This convention, where the extent of automation may substantially be inversely proportional to the amount of user input required or employed during a particular method or method component, or a particular apparatus or function thereof, is also applicable to other aspects of the methods, as well as to aspects of other methods and apparatus within the scope of the present disclosure.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A system for performing in-line nanoprobing on a semiconductor wafer, comprising:
   a vacuum chamber having a floor, a sidewall, and a ceiling;
   a navigation stage having a traveling part and a stationary part and a bearing that when activated, enables relative motion between the traveling part and the stationary part;
   a wafer support attached to the traveling part of the navigation stage;
   a scanning electron microscope (SEM) column attached to the ceiling; and
   a plurality of nanoprobe positioners attached to the ceiling, each nanoprobe positioner having a nanoprobe fork configured for physically contacting selected points on the wafer, each of the nanoprobe positioners being attached to the ceiling in close proximity to the SEM column so as to enable the nanoprobe positioner to insert its nanoprobe fork into a field of view of the SEM column.

2. The system of claim 1, wherein the plurality of nanoprobe positioners are arranged symmetrically around the optical axis of the column.

3. The system of claim 1, wherein the plurality of nanoprobe positioners are arranged so as to have rotational symmetry around the optical axis of the column.

4. The system of claim 1, wherein the plurality of nanoprobe positioners are arranged circularly around the optical axis of the column.

5. The system of claim 1, wherein the plurality of nanoprobe positioners comprise at least one nanoprobe fork having a hardened probe tip and each of the remainder of the nanoprobe positioners having a nanoprobe fork with a conductive probe tip.

6. The system of claim 5, wherein the hardened probe tip comprises diamond.

7. The system of claim 1, wherein each of the plurality of nanoprobe positioners comprises a force sensor for measuring a contact force applied by the nanoprobe fork to the wafer.

8. The system of claim 1, further comprising a plurality of drift sensors for detecting nanoprobe fork vs. wafer co-alignment drift in real-time during probing.

9. The system of claim 8, further comprising a feedback circuit providing signals to each of the nanoprobe positioners to correct positioning of the nanoprobe forks when alignment drift is detected.

10. The system of claim 9, wherein each of the drift sensors comprises an optical quadrant sensor.

11. The system of claim 8, wherein the plurality of drift sensors generate data indicating drift between the wafer and the column.

12. The system of claim 11, wherein the plurality of drift sensors further generate data indicating drift between the column and each of the plurality of probes.

13. The system of claim 1, further comprising an optical microscope that is attached to the ceiling.

14. The system of claim 1, wherein the stationary part comprises part of the ceiling and the bearing comprises an air bearing positioned between part of the ceiling and the traveling part, such that the navigation stage hangs from the ceiling.

15. The system of claim 1, further comprising a controller operable to receive a signal from the SEM column and to generate drive signals for the nanoprobe positioners to move the nanoprobes to assigned targets on the semiconductor wafer.

16. The system of claim 15, wherein the controller comprises an input for CAD design data and an input for Netlist data.

17. A method for performing electrical testing of devices in a semiconductor wafer, comprising:
  positioning a semiconductor wafer on a stage inside a chamber;
  placing the wafer and the chamber under a vacuum; and without breaking the vacuum, performing the following steps:
    determining alignment of the wafer on the stage by imaging the wafer using an optical microscope;
    spatially moving the stage so as to place a region of interest (ROI) in the wafer below a column of a scanning electron microscope (SEM);
    imaging the ROI using the SEM to identify a plurality of targets within the ROI;
    identifying a subset of targets of the plurality of targets to contact;
    assigning each target of the subset of targets to one probe fork of a plurality of probe forks, wherein a subset of probe forks of a plurality of probe forks is assigned, and wherein each of the plurality of probe forks is coupled to a respective nanoprobe positioner of a plurality of nanoprobe positioners;
    generating a set of movement vectors for at least each probe fork of the subset of probe forks to move to an area above their assigned target of the subset of targets;
    operating at least an respective subset of the plurality of nanoprobe positioners so as to cause each nanoprobe positioner of the subset of nanoprobe positioners to place their respective probe forks above the assigned target of the subset of targets;
    co-registering the probe forks of the subset of probe forks and the assigned targets using pattern recognition;
    operating at least the subset the plurality of nanoprobe positioners to land each of their respective prober forks on its assigned target of the subset of targets; and
    performing electrical probing of the wafer.

18. The method of claim 17, further comprising: during the operation of performing probing of the wafer, obtaining readings from drift monitoring sensors.

19. The method of claim 18, further comprising sending at least to the subset of nanoprobe positioners correction signal corresponding to the reading from the drift monitoring sensors to perform drift compensation.

20. The method of claim 18, wherein the step of obtaining readings comprises obtaining data indicating drift between the wafer and the column and obtaining data indicating drift between the column and at least each of the plurality of probe forks of the subset of probe forks.

21. The method of claim 17, wherein performing electrical probing comprises performing at least one of: active voltage contrast (AVC), current vs. voltage dependencies (I-V), capacitance vs. voltage dependencies (C-V), electron beam absorbed current (EBAC), electron beam induced current (EBIC) and electron beam induced resistance change (EBIRCH).

22. The method of claim 17, wherein the step of co-registering comprises using the SEM to image the probe forks of the subset of probe forks and the wafer simultaneously.

23. The method of claim 17, wherein imaging the ROI using the SEM comprises: applying electrical potential to the wafer, scanning an e-beam over the ROI and collecting secondary electrons emanating from the ROI to thereby generate a voltage contrast image of the ROI, wherein regions connected to the electrical potential appear at different intensity from regions insulated from the electrical potential.

* * * * *